US008098085B2

(12) United States Patent
Wang et al.

(10) Patent No.: US 8,098,085 B2
(45) Date of Patent: Jan. 17, 2012

(54) TIME-TO-DIGITAL CONVERTER (TDC) WITH IMPROVED RESOLUTION

(75) Inventors: Kevin H. Wang, San Diego, CA (US); Saru Palakurty, San Diego, CA (US); Frederic Bossu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 77 days.

(21) Appl. No.: 12/436,265

(22) Filed: May 6, 2009

(65) Prior Publication Data

US 2010/0244971 A1 Sep. 30, 2010

Related U.S. Application Data

(60) Provisional application No. 61/164,816, filed on Mar. 30, 2009.

(51) Int. Cl.
*H03D 13/00* (2006.01)

(52) U.S. Cl. .............................................. 327/8; 331/25

(58) Field of Classification Search ......... 327/8; 331/25
See application file for complete search history.

(56) References Cited

U.S. PATENT DOCUMENTS 5,694,377 A 12/1997 Kushnick
2003/0107951 A1 6/2003 Sartschev et al.
2003/0174082 A1 9/2003 Honda
2006/0103566 A1 5/2006 Vemulapalli et al.
2007/0273569 A1 11/2007 Lin

FOREIGN PATENT DOCUMENTS

EP 1137188 9/2001
WO WO2007093221 8/2007

OTHER PUBLICATIONS

International Search Report and Written Opinion—PCT/US2010/029099—International Search Authority, European Patent Office,Nov. 10, 2010.

(Continued)

*Primary Examiner* — Joseph Chang
(74) *Attorney, Agent, or Firm* — Jiayu Xu

(57) ABSTRACT

A time-to-digital converter (TDC) with fine resolution of less than one inverter delay is described. In an exemplary design, the TDC includes first and second delay paths, a delay unit, and a phase computation unit. The first delay path receives a first input signal and a first reference signal and provides a first output. The second delay path receives a second input signal and a second reference signal and provides a second output. The delay unit delays the second input signal relative to the first input signal or delays the second reference signal relative to the first reference signal, e.g., by one half inverter delay. The phase computation unit receives the first and second outputs and provides a phase difference between the input signal and the reference signal. Calibration may be performed to obtain accurate timing for the first and second delay paths.

23 Claims, 13 Drawing Sheets

OTHER PUBLICATIONS

Levine P M et al: "High-resolution flash time-to-digital conversion and calibration for system-on-chip testing Embedded microelectronic systems: status and trends (Part 2)" IEE Proceedings: Computers and Digital Techniques, IEE, GB LNKDD0I: 10.1049/1P-CDT:20045063, vol. 152, No. 3, May 6, 2005, pp. 415-426, XP006024722 ISSN: 1350-2387 the whole document.

Mota M et al: "A four-channel self-calibrating high-resolution time to digital converter" Electronics, Circuits and Systems, 1998 IEEE International Conference on Lisboa, Portugal Sep. 7-10, 1998, Piscataway, NJ, USA,IEEE, US LNKDD0I: 10.1109/ICECS.1998.813351, vol. 1, Sep. 7, 1998, pp. 409-412, XP010366204 ISBN: 978-0-7803-5008-3 the whole document.

Partial International Search Report—PCT/US2010/029099—International Search Authority, European Patent Office, Jul. 26, 2010.

TIME-TO-DIGITAL CONVERTER (TDC) WITH IMPROVED RESOLUTION

CLAIM OF PRIORITY UNDER 35 U.S.C. §119

The present Application for Patent claims priority to Provisional Application Ser. No. 61/164,816, entitled "TIME-TO-DIGITAL CONVERTER (TDC) WITH IMPROVED RESOLUTION," filed Mar. 30, 2009, assigned to the assignee hereof, and expressly incorporated herein by reference.

BACKGROUND

I. Field

The present disclosure relates generally to electronics, and more specifically to a time-to-digital converter (TDC).

II. Background

A TDC is a digital circuit that receives an input signal and a reference signal, detects the phase difference between the two signals, and provides a digital value of the detected phase difference. The phase difference between the two signals may be given by the time difference between the leading edge of the input signal and the leading edge of the reference signal. The TDC typically includes a set of inverters coupled in series and used to determine the phase difference between the two signals. The TDC digitizes this phase difference and provides the digitized phase difference. The resolution of the TDC, which is the quantization step size for the digitized phase difference, is typically determined by the delay of one inverter in the set of inverters.

The TDC may be used in a digital phase locked loop (DPLL) or some other circuit. It may be desirable to obtain fine resolution for the TDC in order to improve the performance of the DPLL or some other circuit in which the TDC is used.

SUMMARY

Techniques for implementing a TDC with improved resolution are described herein. In an aspect, a TDC with fine resolution of less than one inverter delay may be implemented with multiple delay paths having different time offsets of less than one inverter delay. In an exemplary design, the TDC may comprise first and second delay paths, a delay unit, and a phase computation unit. The first delay path may receive a first input (Sin1) signal and a first reference (Ref1) signal and may provide a first output (Dout1) indicative of a phase difference between the Sin1 and Ref1 signals. The second delay path may receive a second input (Sin2) signal and a second reference (Ref2) signal and may provide a second output (Dout2) indicative of a phase difference between the Sin2 and Ref2 signals. The delay unit may delay the Sin2 signal relative to the Sin1 signal or may delay the Ref2 signal relative to the Ref1 signal, e.g., by one half inverter delay. The phase computation unit may receive the first and second outputs from the first and second delay paths and may provide a phase difference between an input (Sin) signal and a reference (Ref) signal. The Sin1 and Sin2 signals may be derived based on the Sin signal, and the Ref1 and Ref2 signals may be derived based on the Ref signal, as described below. The first and second outputs may have a resolution of one inverter delay. The phase difference between the Sin signal and the Ref signal may have a resolution of less than one (e.g., one half) inverter delay. The delay paths, the delay unit, and the phase computation unit may be implemented as described below.

The TDC may also comprise one or more additional delay paths and one or more additional delay units for even finer resolution.

In another aspect, calibration may be performed to obtain accurate timing for the first and second delay paths in the TDC. In an exemplary design of calibration, the delay of the Ref1 signal may be adjusted to time align the Ref1 signal with the Sin1 signal for the first delay path. The delay of the Ref2 signal may be adjusted to time align the Ref2 signal with the Sin2 signal for the second delay path. The delay of the Ref2 signal may be further adjusted to obtain one additional inverter delay for the Ref2 signal. One half inverter delay for the Ref2 signal may then be determined based on (i) the delay to time align the Ref2 signal with the Sin2 signal and (ii) the delay to obtain one additional inverter delay for the Ref2 signal. The TDC may then be configured to delay the Ref2 signal by one half inverter delay relative to the Ref1 signal. The Ref2 signal may also be delayed by some other fraction of one inverter delay.

Various aspects and features of the disclosure are described in further detail below.

DETAILED DESCRIPTION

The word "exemplary" is used herein to mean "serving as an example, instance, or illustration." Any design described herein as "exemplary" is not necessarily to be construed as preferred or advantageous over other designs.

Figure 1:
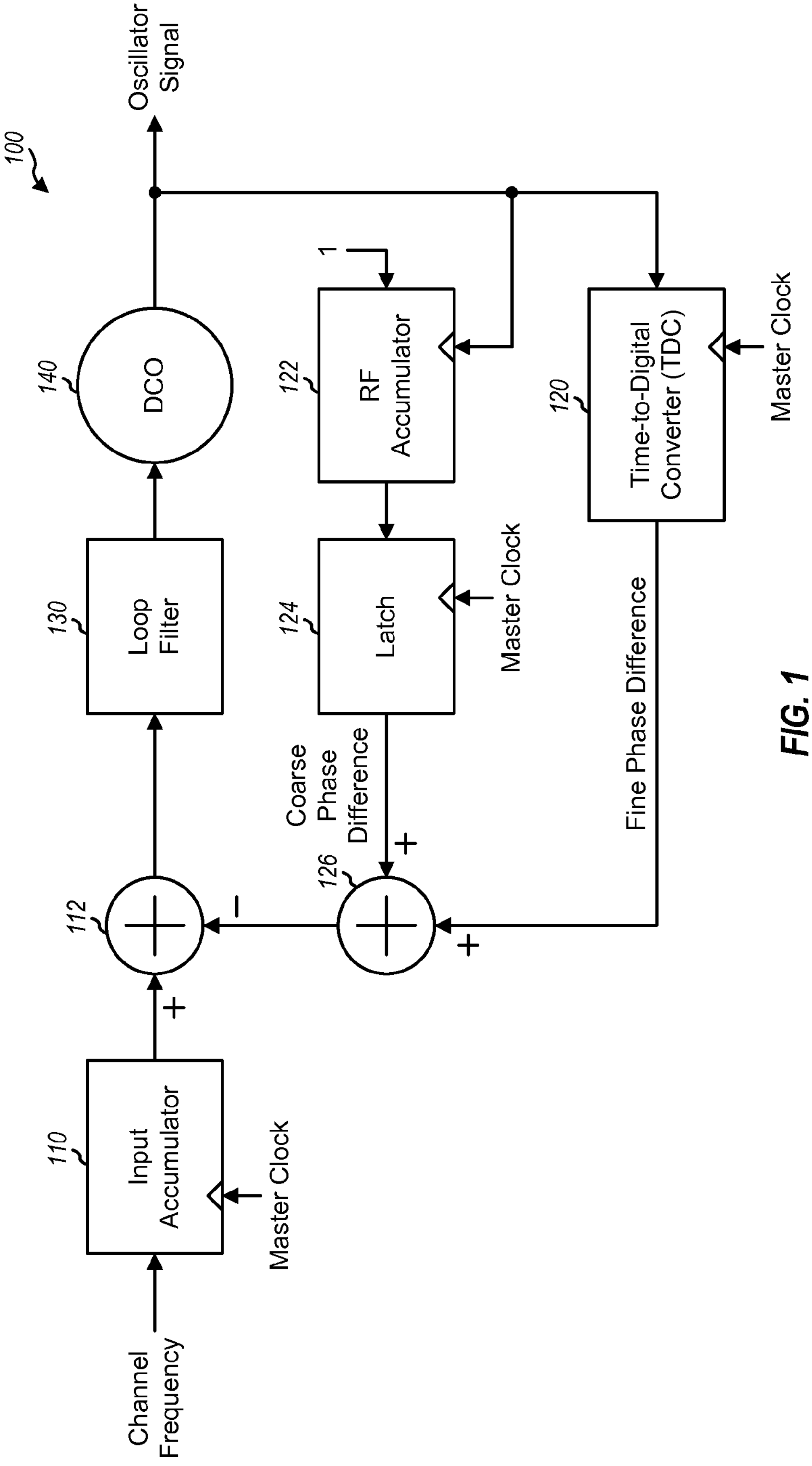
FIG. 1 shows an exemplary design of a DPLL with a TDC.

FIG. 1 shows a block diagram of an exemplary design of a DPLL 100 utilizing a TDC 120. Within DPLL 100, an input accumulator 110 accumulates a static value for a desired output/channel frequency (e.g., the center frequency of a frequency channel used for communication) and provides an input phase. The accumulation essentially converts frequency to phase. Input accumulator 110 is triggered by a master clock, which may have a fixed frequency of $f_{ref}$.

A radio frequency (RF) accumulator 122 increments by one for each oscillator cycle, which is one cycle of an oscillator signal from a digital controlled oscillator (DCO) 140. A latch 124 latches the output of RF accumulator 122 when triggered by the master clock and provides a coarse phase difference. TDC 120 receives the oscillator signal and the master clock, determines the phase of the oscillator signal when triggered by the master clock, and provides a fine phase difference between the oscillator signal and the master clock. TDC 120 implements a fractional phase sensor for DPLL 100. A summer 126 receives and sums the coarse phase difference from latch 124 and the fine phase difference from TDC 120 and provides a feedback phase. A summer 112 subtracts the feedback phase from the input phase and provides a phase error. A loop filter 130 filters the phase error and provides a control signal for DCO 140. Loop filter 130 sets the loop dynamics (e.g., the closed loop bandwidth, the acquisition speed, etc.) of DPLL 100. The control signal may have a suitable number of bits of resolution, e.g., 8, 12, 16, 20, 24, or more bits of resolution.

DCO 140 receives the control signal from loop filter 130 and generates the oscillator signal at the desired output frequency of $f_{osc}$. DCO 140 may also be replaced with some other types of oscillator such as a voltage controlled oscillator (VCO), a current controlled oscillator (ICO), etc. The output/channel frequency may be determined by the application for which DPLL 100 is used. For example, DPLL 100 may be used for a wireless communication device, and $f_{osc}$ may be hundreds of megahertz (MHz) or few gigahertz (GHz). The master clock may be generated based on a crystal oscillator (XO), a voltage controlled crystal oscillator (VCXO), a temperature compensated crystal oscillator (TCXO), or some other type of oscillator having an accurate frequency. The frequency of the master clock may be much lower than the frequency of the oscillator signal. For example, $f_{ref}$ may be tens of MHz whereas $f_{osc}$ may be several GHz. The master clock may also be referred to as a reference clock, etc.

The input phase from accumulator 110, the output phase from DCO 140, and the feedback phase from summer 126 may be given in units of oscillator cycle. In the exemplary design shown in FIG. 1, the feedback path of DPLL 100 includes (i) RF accumulator 122 to measure the coarse phase difference, which is given in integer number of oscillator cycles, and (ii) TDC 120 to measure the fine phase difference, which is given by a fraction of one oscillator cycle. The combination of RF accumulator 122 and TDC 120 measures the total phase difference between the master clock and a desired signal.

Figure 2:
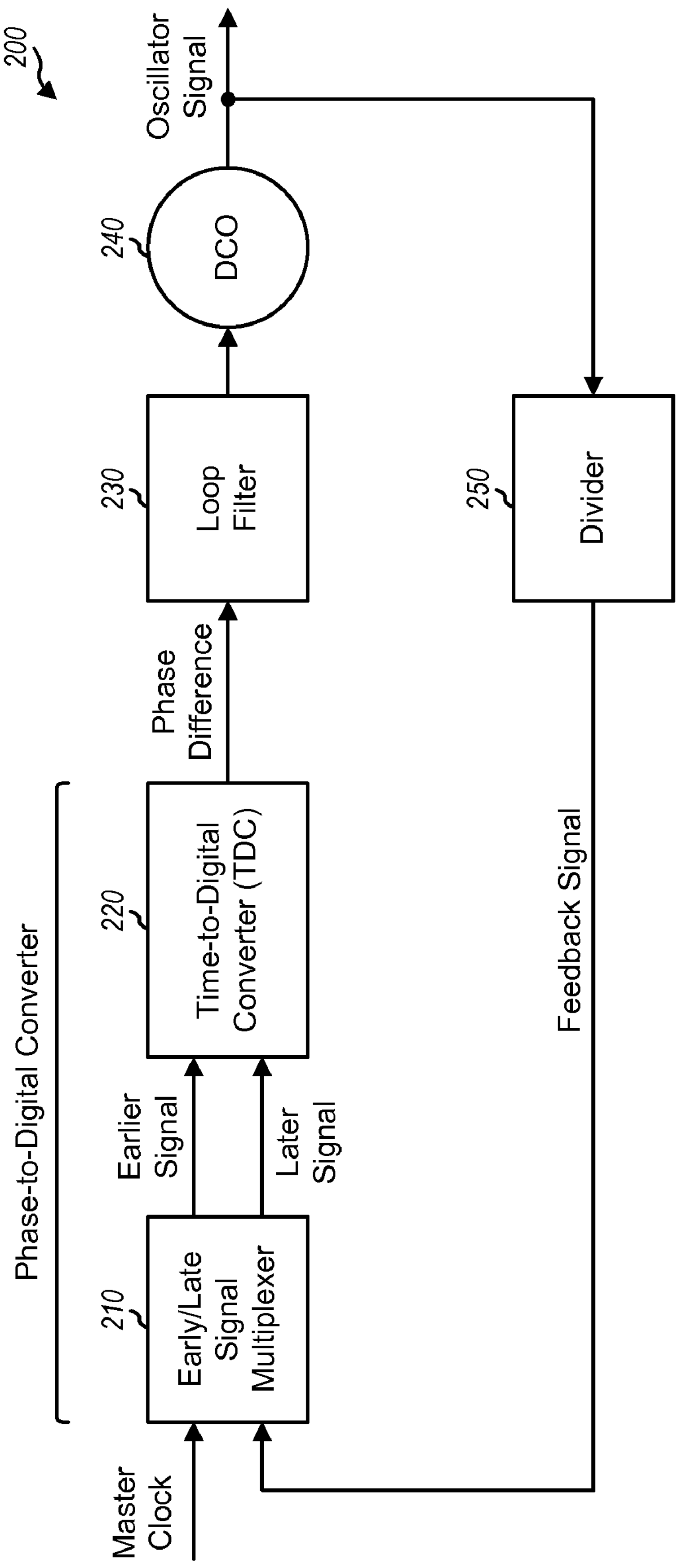
FIG. 2 shows another exemplary design of a DPLL with a TDC.

FIG. 2 shows a block diagram of an exemplary design of a DPLL 200 utilizing a TDC 220. Within DPLL 200, an early/late signal multiplexer 210 receives a master clock and a feedback signal from a divider 250, determines whether the master clock is earlier than the feedback signal or vice versa, provides either the master clock or the feedback signal as an earlier signal, and provides the other signal as a later signal. TDC 220 determines the phase difference between the earlier signal and the later signal, quantizes the phase difference, and provides the quantized phase difference. Signal multiplexer 210 and TDC 220 form a phase-to-digital converter.

A loop filter 230 filters the phase difference from TDC 220 and provides a control signal. A DCO 240 receives the control signal and generates an oscillator signal at the desired output frequency of $f_{osc}$. A divider 250 divides the oscillator signal from DCO 240 in frequency by an integer or non-integer ratio and provides the feedback signal. The frequency divider factor may be determined by the oscillation frequency $f_{osc}$ of DCO 260 and the frequency $f_{ref}$ of the master clock.

FIGS. 1 and 2 show two exemplary DPLLs utilizing TDCs. A TDC may also be used in a DPLL implemented in other manners. A TDC may also be used in other circuits.

A TDC may be implemented with a delay path having a set of inverters coupled in series, as described below. The delay path may be used to determine the phase difference between an input signal and a reference signal. For DPLL 100 in FIG. 1, the input signal may be the oscillator signal, and the reference signal may be the master clock. For DPLL 200 in FIG. 2, the input signal may be the earlier signal, and the reference signal may be the later signal. The input signal and the reference signal for the TDC may also be other signals for other DPLLs. In any case, the phase difference from the TDC may have a resolution determined by the delay of one inverter, which is referred to as one inverter delay. Finer resolution may be obtained with a shorter inverter delay. However, there is typically a limit on how short the inverter delay can be made, which may be dependent on an integrated circuit (IC) process technology used to fabricate the TDC.

Figure 3:
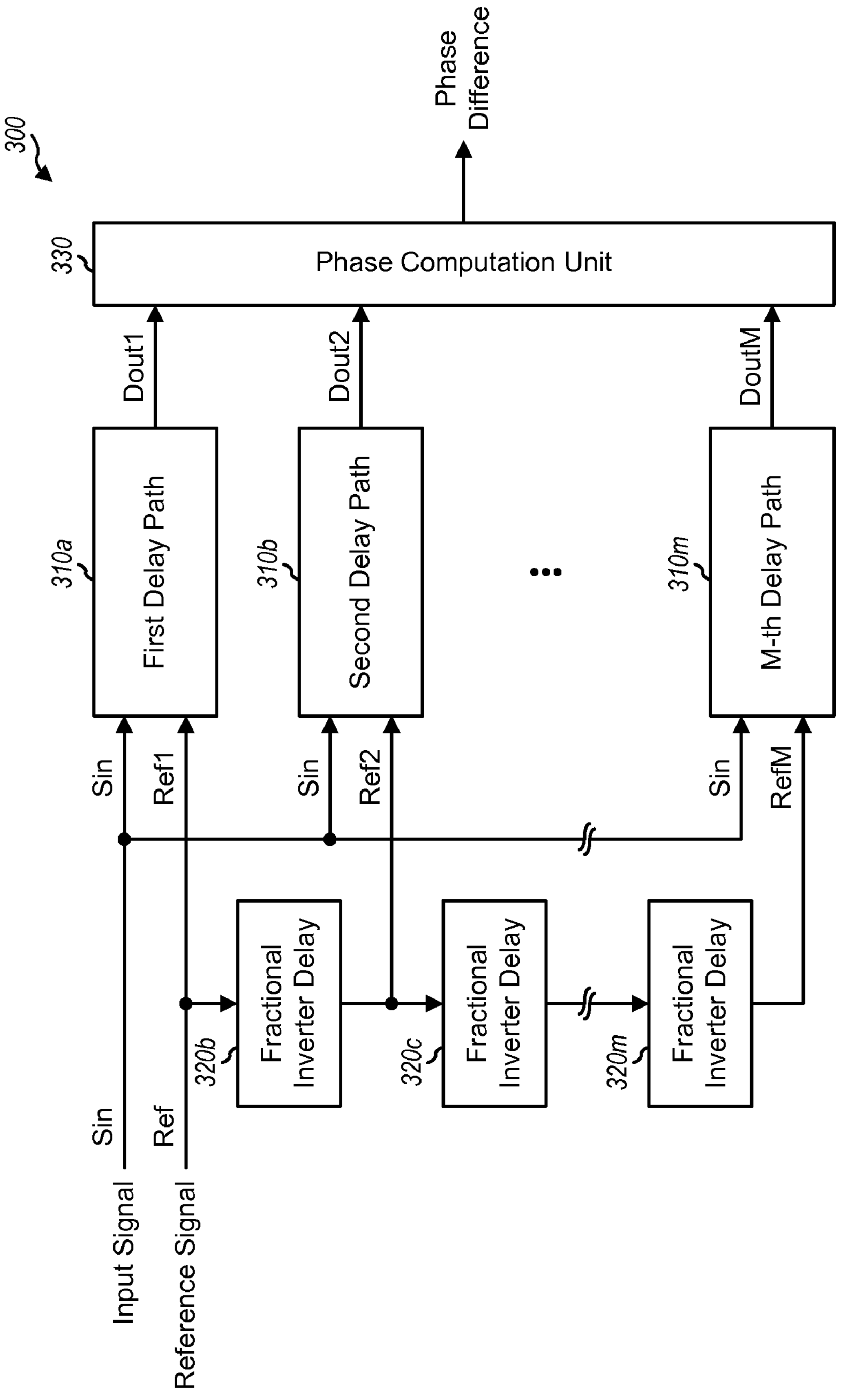
FIG. 3 shows an exemplary design of a TDC with finer resolution.

FIG. 3 shows a block diagram of an exemplary design of a TDC 300 with finer resolution, i.e., with resolution of less than one inverter delay. TDC 300 may be used for TDC 120 in FIG. 1 or TDC 220 in FIG. 2.

In the exemplary design shown in FIG. 3, TDC 300 includes multiple (M) delay paths **310*a* through 310*m* coupled in parallel, where M may be any integer value greater than one. TDC 300 further includes M−1 delay units 320*b* through 320*m* coupled in series. An input (Sin) signal, which may be the oscillator signal in FIG. 1 or the earlier signal in FIG. 2, is provided to all M delay paths 310*a* through 310*m*. A reference (Ref) signal, which may be the master clock in FIG. 1 or the later signal in FIG. 2, is provided to the first delay path 310*a* and also to the first delay unit 320*b*. Each remaining delay unit 320 receives the output of a preceding delay unit and provides its delayed reference signal to an associated delay path 310**.

Each delay path 310 may include a set of inverters coupled in series, as described below. Each delay path 310 digitizes the phase difference between the input signal and its reference signal and provides an output indicative of the phase difference between the two signals. The digitized phase difference may have a resolution of one inverter delay. The M delay paths **310*a* through 310*m* provide M outputs Dout1** through DoutM, respectively.

The M−1 delay units **320*b* through 320*m* may each provide a delay of $T_{inv}/M$, where $T_{inv}$ is one inverter delay. Each delay unit 320 may thus provide a fraction of one inverter delay. Since the M−1 delay units 320*b* through 320*m* are coupled in series, the M reference signals for the M delay paths 310*a* through 310*m* may be offset by $T_{inv}/M$ from one another. The M delay paths 310*a* through 310*m* may then digitize the common input signal with M different reference signals at different time offsets. This may then allow TDC 300 to achieve a finer resolution of $T_{inv}/M$ (instead of $T_{inv}$). For example, if M is equal to two, then TDC 300 may include two parallel delay paths 310*a* and 310*b*** that may be offset by $T_{inv}/2$ from each other and may be able to achieve a finer resolution of $T_{inv}/2$.

A phase computation unit 330 receives the outputs from the M delay paths **310*a* through 310*m*, performs post-processing on the outputs, and provides the phase difference between the input signal and the reference signal. The phase difference from TDC 300** may have finer resolution than that of a conventional TDC with just one delay path.

Figure 4:
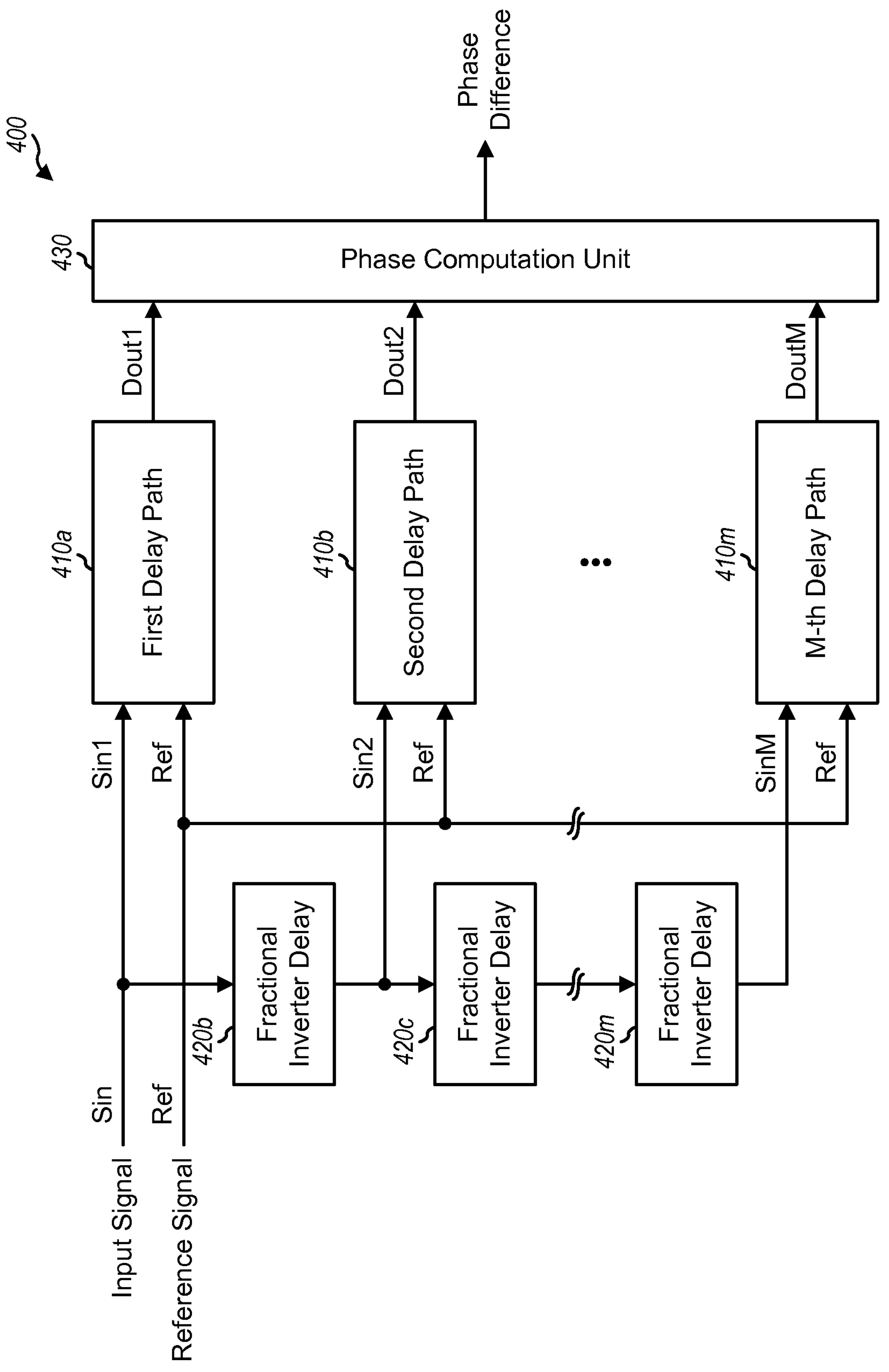
FIG. 4 shows another exemplary design of a TDC with finer resolution.

FIG. 4 shows a block diagram of an exemplary design of a TDC 400 with finer resolution. TDC 400 may also be used for TDC 120 in FIG. 1 or TDC 220 in FIG. 2. In the exemplary design shown in FIG. 4, TDC 400 includes M delay paths 410*a* through 410*m* coupled in parallel, where M>1. TDC 400 further includes M−1 delay units 420*b* through 420*m* coupled in series. A reference (Ref) signal is provided to all M delay paths 410*a* through 410*m*. An input (Sin) signal is provided to the first delay path 410*a* and also to the first delay unit 420*b*. Each remaining delay unit 420 receives the output of a preceding delay unit and provides its delayed input signal to an associated delay path 410. Each delay path 410 digitizes the phase difference between its input signal and the reference signal and provides an output indicative of the phase difference between the two signals. The digitized phase difference may have a resolution of one inverter delay. The M delay paths 410*a* through 410*m* provide M outputs Dout1 through DoutM, respectively.

The M−1 delay units 420*b* through 420*m* may each provide a delay of $T_{inv}/M$. Since the M−1 delay units 420*b* through 420*m* are coupled in series, the M input signals for the M delay paths 410*a* through 410*m* may be offset by $T_{inv}/M$ from one another. The M delay paths 410*a* through 410*m* may then digitize M different input signals at different time offsets with the common reference signal. This may then allow TDC 400 to achieve a finer resolution of $T_{inv}/M$. A phase computation unit 430 receives and processes the outputs from the M delay paths 410*a* through 410*m* and provides the phase difference between the input signal and the reference signal.

As shown in FIGS. 3 and 4, finer resolution may be achieved for a TDC by using multiple delay paths and offsetting either the input signal or the reference signal by different fractional delays of less than one inverter delay. Each delay path may digitize the phase difference between its input signal and its reference signal and may provide a phase difference having a resolution of one inverter delay. The phase differences from the M delay paths with different time offsets may be combined to obtain a final phase difference between the input signal and the reference signal having finer resolution.

For clarity, much of the description below is for a simplified version of the exemplary design shown in FIG. 3, with the reference signal being delayed for different delay paths. Much of the description below may be applicable for the exemplary design shown in FIG. 4, with the input signal being delayed for different delay paths.

Figure 5:
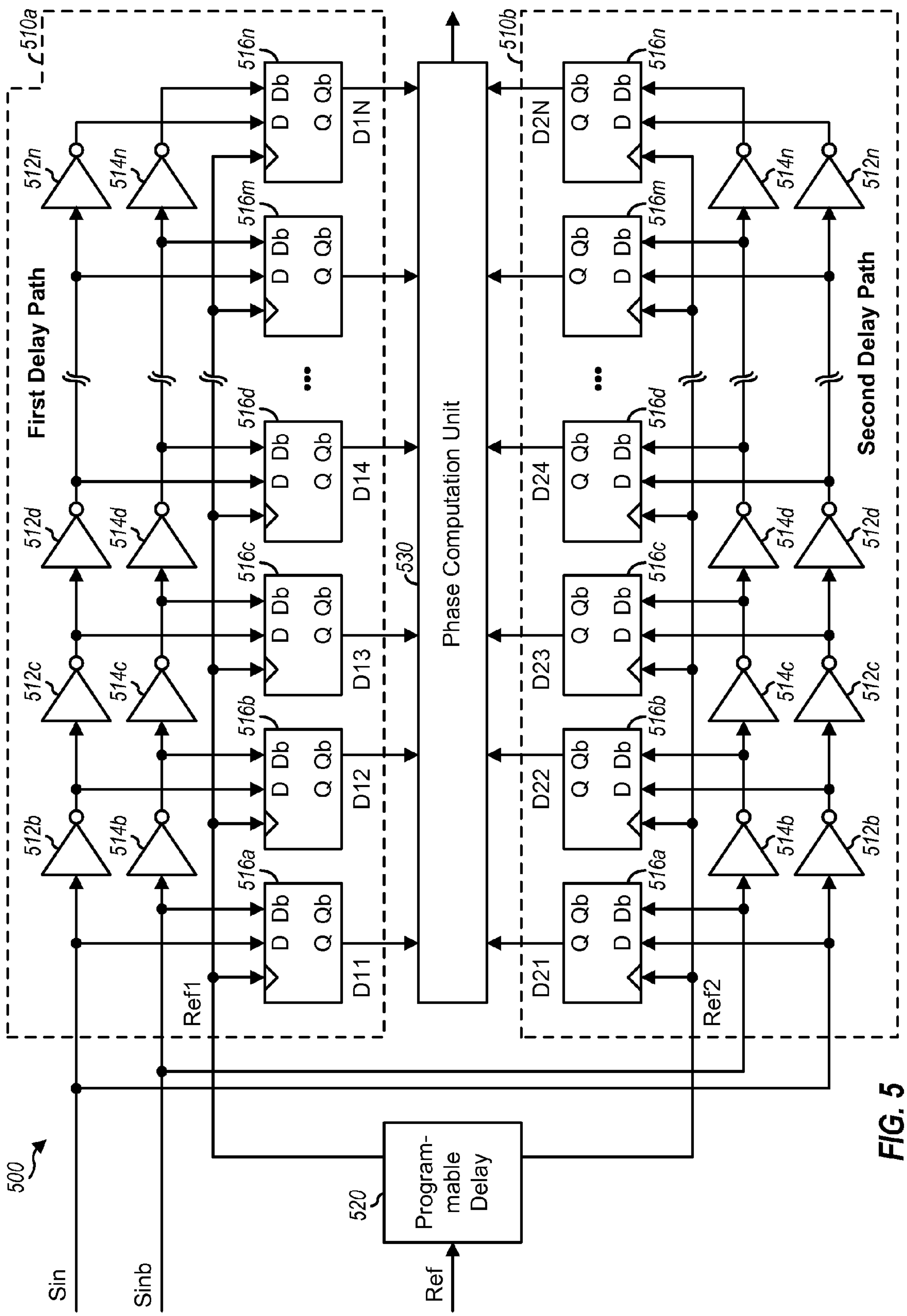
FIG. 5 shows an exemplary design of a TDC with two delay paths.

FIG. 5 shows a block diagram of an exemplary design of a TDC 500, which may also be used for TDC 120 in FIG. 1 or TDC 220 in FIG. 2. FIG. 5 shows a design in which (i) the reference signal is a single-ended signal and (ii) the input signal is a differential signal comprising a non-inverting input (Sin) signal and an inverting input (Sinb) signal.

In the exemplary design shown in FIG. 5, TDC 500 includes a first delay path 510*a*, a second delay path 510*b*, a programmable delay unit 520, and a phase computation unit 530. Programmable delay unit 520 receives the reference (Ref) signal, provides a first reference (Ref1) signal to first delay path 510*a*, and provides a second reference (Ref2) signal to second delay path 510*b*. The Ref2 signal is delayed by $T_{inv}/2$ relative to the Ref1 signal. First delay path 510*a* receives the differential input (Sin and Sinb) signal and the Ref1 signal and provides a first output (Dout1) comprising D11 through D1N output signals. Second delay path 510*b* receives the differential input signal and the Ref2 signal and provides a second output (Dout2) comprising D21 through D2N output signals. Phase computation unit 530 receives the Dout1 and Dout2 outputs and provides the phase difference between the input signal and the reference signal.

Within first delay path 510*a*, a first set of N−1 inverters 512*b* through 512*n* is coupled in series, with the first inverter 512*b* receiving the Sin signal. A second set of N−1 inverters 514*b* through 514*n* is coupled in series, with the first inverter 514*b* receiving the Sinb signal. A set of N flip-flops 516*a* through 516*n* receives the Ref1 signal at their clock input. Flip-flop 516*a* receives the Sin and Sinb signals at its data (D) and inverted data (Db) inputs, respectively. Each remaining flip-flop 516*x* receives the outputs of inverters 512*x* and 514*x* at its D and Db inputs, respectively, where x∈{b, c, . . . , n}. The N flip-flops 516*a* through 516*n* provide N digital output signals D11 through D1N, respectively, to phase computation unit 530. To obtain the same polarity for all N output signals, the N flip-flops 516*a* through 516*n* alternately provide their output (Q) and inverted output (Qb) for the D11 through D1N signals. In particular, output signals D11, D13, etc. are generated based on even numbers of inverters and are provided by the Q outputs of flip-flops 516*a*, 516*c*, etc. Output signals D12, D14, etc. are generated based on odd numbers of inverters and are provided by the Qb outputs of flip-flops 516*b*, 516*d*, etc.

Second delay path 510*b* includes the first set of N−1 inverters 512*b* through 512*n*, the second set of N−1 inverters 514*b* through 514*n*, and the set of N flip-flops 516*a* through 516*n*, which are coupled as described above for first delay path 510*a*. The Sin and Sinb signals are provided to inverters 512*a* and 514*a*, respectively, and also to the D and Db inputs of the first flip-flop 516*a*. The N flip-flops 516*a* through 516*n* receive the Ref2 signal at their clock input and provide N output signals D21 through D2N, respectively, to phase computation unit 530.

The delay of each inverter, $T_{inv}$, may be made as short as possible in order to achieve good resolution. However, the inverter delay is typically limited by the IC process technology used to fabricate TDC 500. The N−1 inverters in each set of inverters may provide a total delay of approximately one cycle of the input signal. For example, if the frequency of the input signal is 2 GHz, then one cycle of the input signal is 500 picoseconds (ps), and about $N \approx 500/T_{inv}$ inverters may be used for each set of inverters, where $T_{inv}$ is given in units of ps.

In each delay path 510, the N differential input signals for the N flip-flops 516*a* through 516*n* are delayed by different amounts by the two sets of inverters 512 and 514. Each flip-flop 516 samples its differential input signal with its reference signal and provides the sampled output on its output signal. The phase difference between the input signal and the reference signal may be determined based on the number of zeros ('0') and the number of ones ('1') in the output signals.

Figure 6:
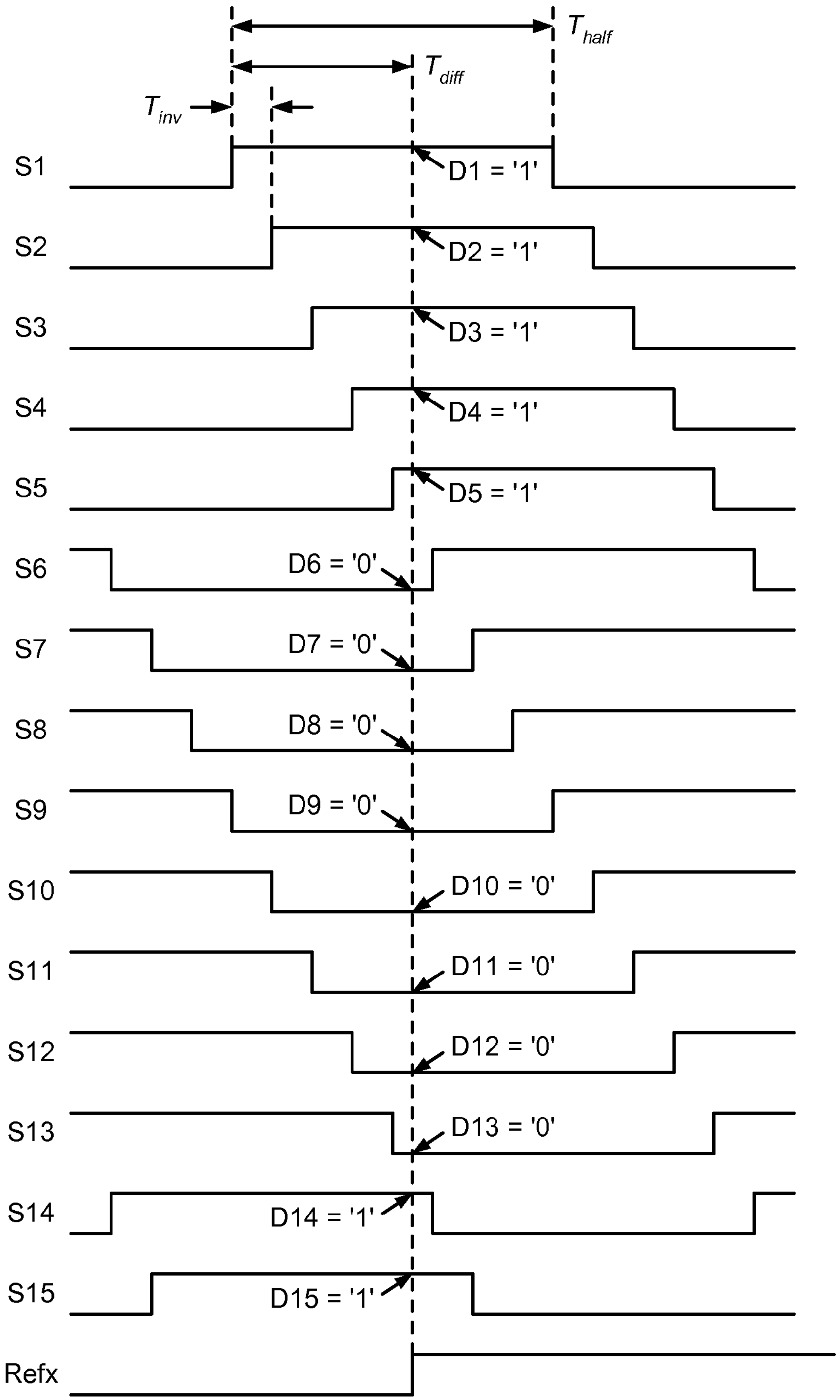
FIG. 6 shows a timing diagram illustrating operation of one delay path.

FIG. 6 shows a timing diagram illustrating the operation of one delay path, e.g., delay path 510*a* or 510*b* in FIG. 5. In the example shown in FIG. 6, the delay path includes 14 inverters in each set of inverters and 15 flip-flops. The 15 flip-flops receive 15 input signals S1 through S15 and provide 15 output signals D1 through D15. The 15 input signals for the 15 flip-flops are delayed by $T_{inv}$ from one another. The Refx signal may be the Ref1 signal for delay path 510*a* or the Ref2 signal for delay path 510*b*.

In the example shown in FIG. 6, the leading/rising edge of the Refx signal occurs after the leading edge of the S5 signal, before the leading edge of the S6 signal, after the trailing/falling edge of the S13 signal, and before the trailing edge of the S14 signal. The first five flip-flops would then provide logic high (or '1') on their output signals, so that D= . . . = D5='1'. The next eight flip-flops would provide logic low (or '0') on their output signals, so that D6= . . . =D13='0'. The last two flip-flops would provide logic high on their output signals, so that D14=D15='1'.

The logic value of the first output D1 indicates whether the leading edge of the input signal is early or late relative to the leading edge of the Refx signal. In particular, D1='1' (as shown in FIG. 6) indicates that the input signal is early relative to the Refx signal, and D1='0' (not shown in FIG. 6) indicates that the input signal is late relative to the Refx signal. The number of ones (or zeros) prior to the first flip in the polarity of the output signals is indicative of the time difference, $T_{diff}$, between the leading or trailing edge of the S1 signal and leading edge of the Refx signal. In the example shown in FIG. 6, the time difference is approximately five inverter delays (or $T_{diff}\approx 5\,T_{inv}$) corresponding to the five ones on the first five output signals D1 through D5. The number of zeros (or ones) between the first flip and the second flip in the polarity of the output signals is indicative of one half cycle of the input signal, $T_{half}$. In the example shown in FIG. 6, one half cycle of the input signal is approximately eight inverter delays (or $T_{half}\approx 8\,T_{inv}$) corresponding to the eight zeros on the next eight output signals $D_6$ through $D_{13}$.

In general, each delay path may include any number of inverters in each set and any number of flip-flops. The number of ones (or zeros) prior to the first polarity flip may be dependent on the time difference between the edges of the input signal and the reference signal as well as the inverter delay. The number of zeros (or ones) between the first polarity flip and the second polarity flip may be dependent on the frequency of the input signal as well as the inverter delay.

Figure 7:
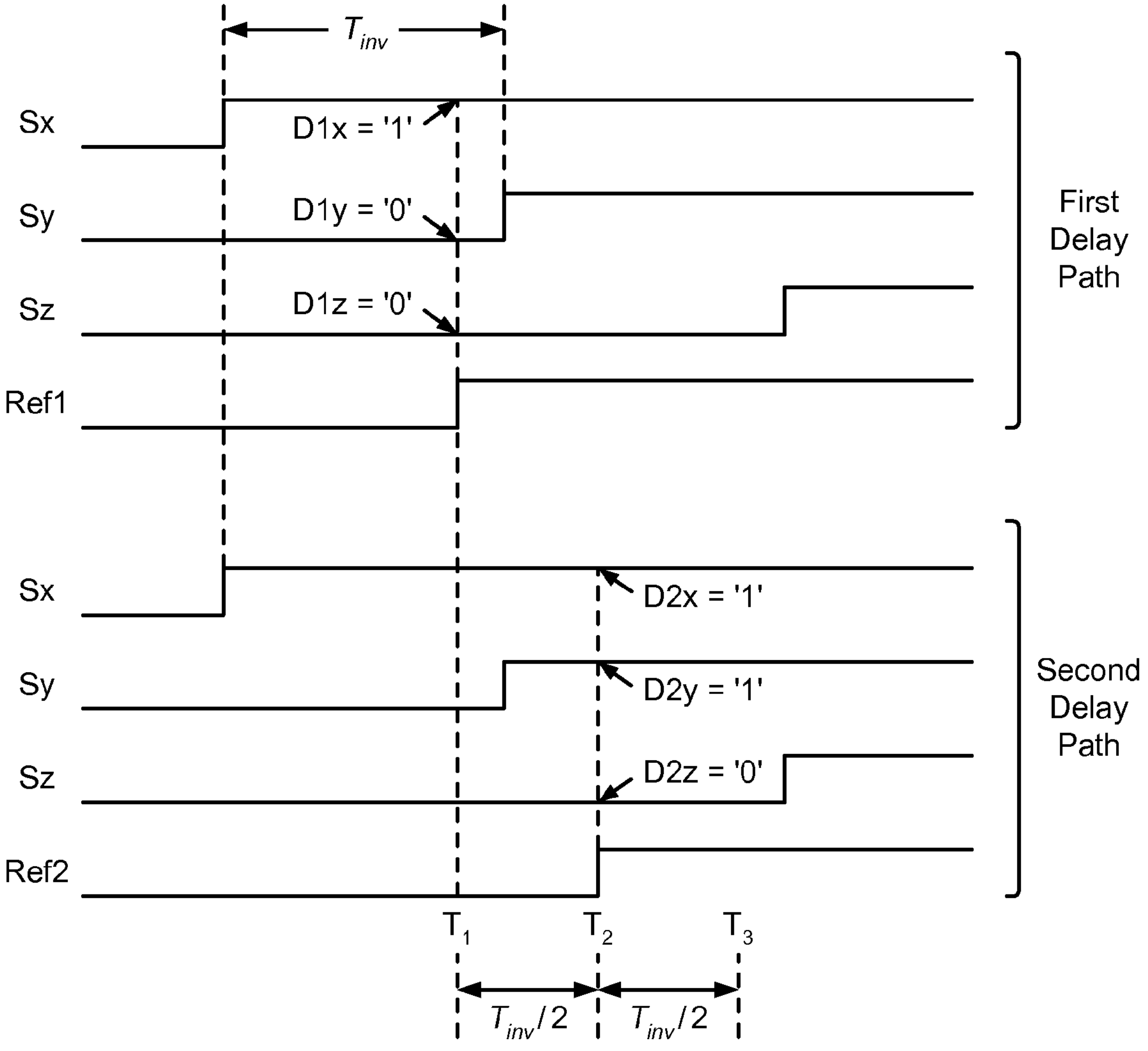
FIG. 7 illustrates operation of the TDC in FIG. 5 with two delay paths.

FIG. 7 shows a timing diagram illustrating the operation of the two delay paths 510*a* and 510*b* in FIG. 5. For simplicity, the input and output signals for only three flip-flops in each delay path are shown in FIG. 7. The three flip-flops in the first delay path 510*a* receive three input signals Sx, Sy and Sz as well as the Ref1 signal and provide three output signals D1*x*, D1*y* and D1*z*. The three flip-flops in the second delay path 510*b* receive the three input signals Sx, Sy and Sz as well as the Ref2 signal and provide three output signals D2*x*, D2*y* and D2*z*. The Sx, Sy and Sz signals are delayed by $T_{inv}$ from each other. The Ref2 signal is delayed by $T_{inv}/2$ relative to the Ref1 signal by delay unit 520 in FIG. 5.

In the example shown in FIG. 7, the leading edge of the Ref1 signal occurs after the leading edge of the Sx signal and before the leading edge of the Sy signal in the first delay path. The three flip-flops in the first delay path would then provide D1*x*='1' and D1*y*=D1*z*='0'. The leading edge of the Ref2 signal occurs after the leading edge of the Sy signal and before the leading edge of the Sz signal in the second delay path. The three flip-flops in the second delay path would then provide D2*x*=D2*y*='1' and D2*z*='0'. If only one delay path (e.g., the first delay path 510*a*) is used for the TDC, then the leading edge of the Sy signal may be deemed to have occurred between time $T_1$ and time $T_3$, which are separated by $T_{inv}$. However, by using two delay paths that are offset by $T_{inv}/2$ from each other, the leading edge of the Sy signal may be deemed to have occurred between time $T_1$ and time $T_2$, which are separated by $T_{inv}/2$. Resolution may thus be improved by a factor of two by using two delay paths and offsetting the reference signals for the two delay paths.

Figure 8:
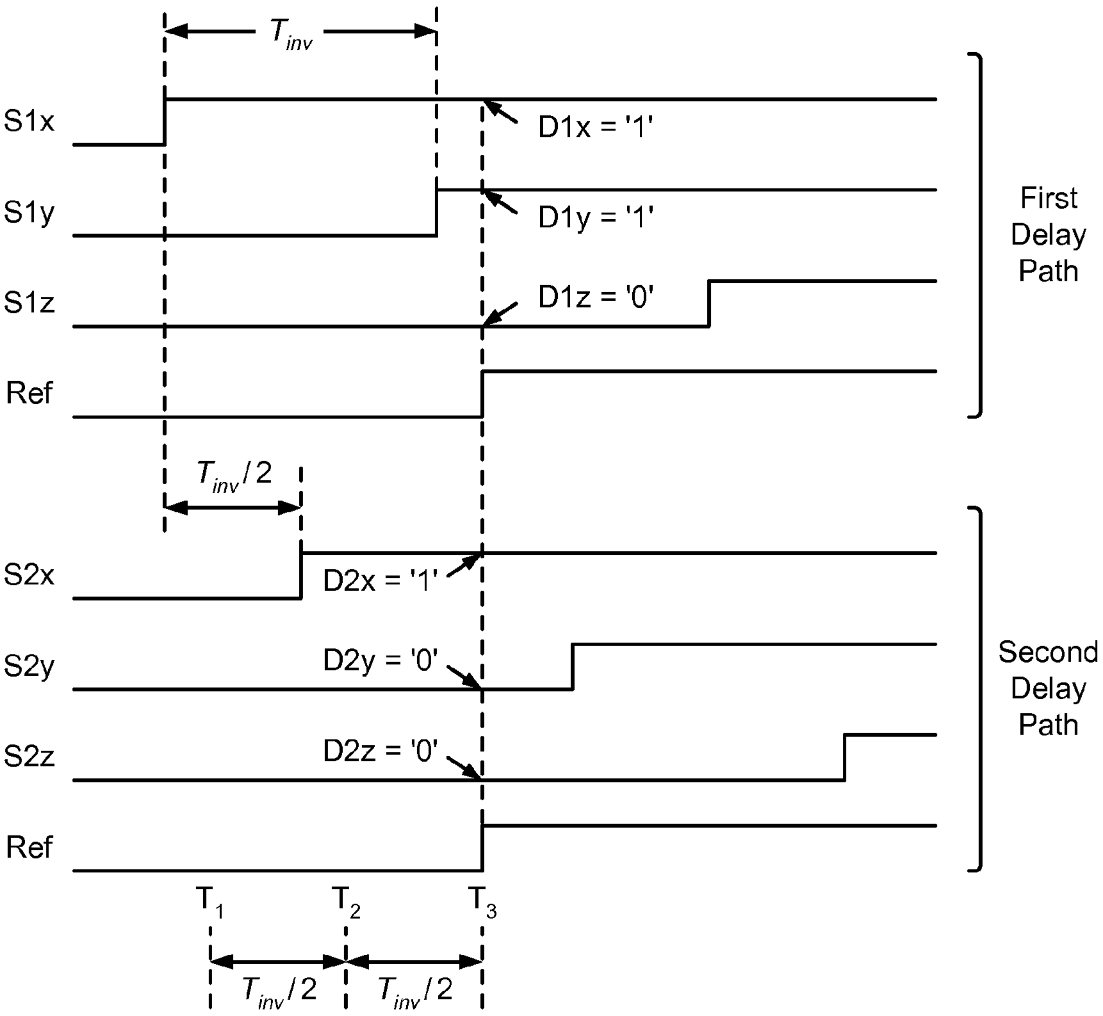
FIG. 8 illustrates operation of the TDC in FIG. 4 with two delay paths.

FIG. 8 shows a timing diagram illustrating the operation of two delay paths 410*a* and 410*b* for the exemplary design shown in FIG. 4 with M=2. In this case, the input signal (and not the reference signal) is delayed. For simplicity, the input and output signals for only three flip-flops in each delay path are shown in FIG. 8. The three flip-flops in the first delay path 410*a* receive three input signals S1*x*, S1*y* and S1*z* and the Ref signal and provide three output signals D1*x*, D1*y* and D1*z*. The three flip-flops in the second delay path 410*b* receive three input signals S2*x*, S2*y* and S2*z* and the Ref signal and provide three output signals D2*x*, D2*y* and D2*z*. The S1*x*, S1*y* and S1*z* signals are delayed by $T_{inv}$ from each other, and the S2*x*, S2*y* and S2*z* signals are also delayed by $T_{inv}$ from each other. The S2*x*, S2*y* and S2*z* signals are delayed by $T_{inv}/2$ relative to the S1*x*, S1*y* and S1*z* signals, respectively.

In the example shown in FIG. 7, the leading edge of the Ref signal occurs after the leading edge of the S1*y* signal and before the leading edge of the S1*z* signal in the first delay path. The three flip-flops in the first delay path would then provide D1*x*=D1*y*='1' and D1*z*='0'. The leading edge of the Ref signal also occurs after the leading edge of the S2*x* signal and before the leading edge of the S2*y* signal in the second delay path. The three flip-flops in the second delay path would then provide D2*x*='1' and D2*y*=D2*z*='0' If only one delay path (e.g., the first delay path 410*a*) is used for the TDC, then the leading edge of the S1*y* signal may be deemed to have occurred between time $T_1$ and time $T_3$, which are separated by $T_{inv}$. However, by using two delay paths that are offset by $T_{inv}/2$ from each other, the leading edge of the S1*y* signal may be deemed to have occurred between time $T_1$ and time $T_2$, which are separated by $T_{inv}/2$. Resolution may thus be improved by a factor of two by using two delay paths and offsetting the input signals for the two delay paths.

Figure 9:
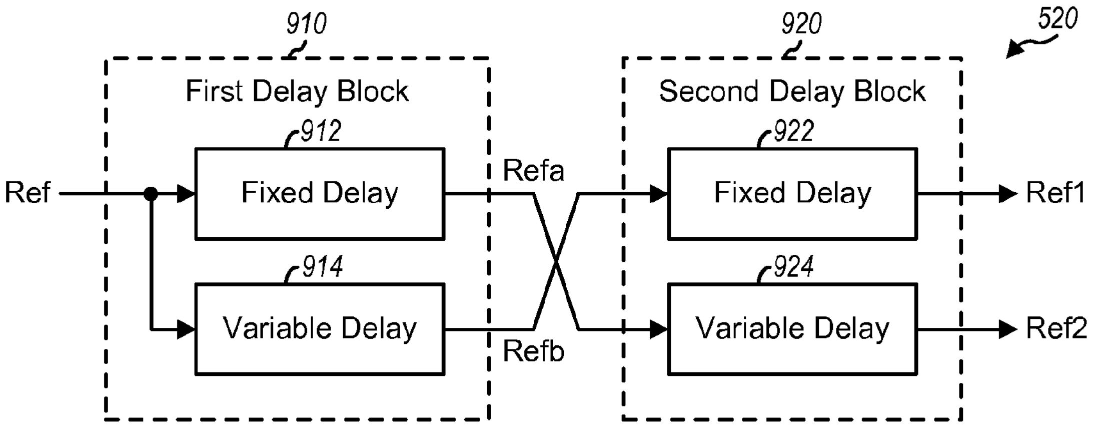
FIG. 9 shows an exemplary design of a programmable delay unit.

FIG. 9 shows a block diagram of an exemplary design of programmable delay unit 520 in FIG. 5. In this design, delay unit 520 includes a first delay block 910 and a second delay block 920 coupled in series. The first delay block 910 includes a fixed delay unit 912 and a variable delay unit 914. Delay unit 912 receives and delays the Ref signal by a fixed amount and provides a Refa signal. Delay unit 914 receives and delays the Ref signal by a variable amount and provides a Refb signal. The second delay block 920 includes a fixed delay unit 922 and a variable delay unit 924. Delay unit 922 receives and delays the Refb signal by a fixed amount and provides the Ref1 signal. Delay unit 924 receives and delays the Refa signal by a variable amount and provides the Ref2 signal.

The exemplary design shown in FIG. 9 allows the delays of the Ref1 and Ref2 signals to be adjusted to account for mismatches between the two delay paths 510*a* and 510*b* as well as variations in IC process, temperature, power supply, etc. This design also support calibration to accurately adjust the delays of the Ref1 and Ref2 signals, as described below.

Figure 10:
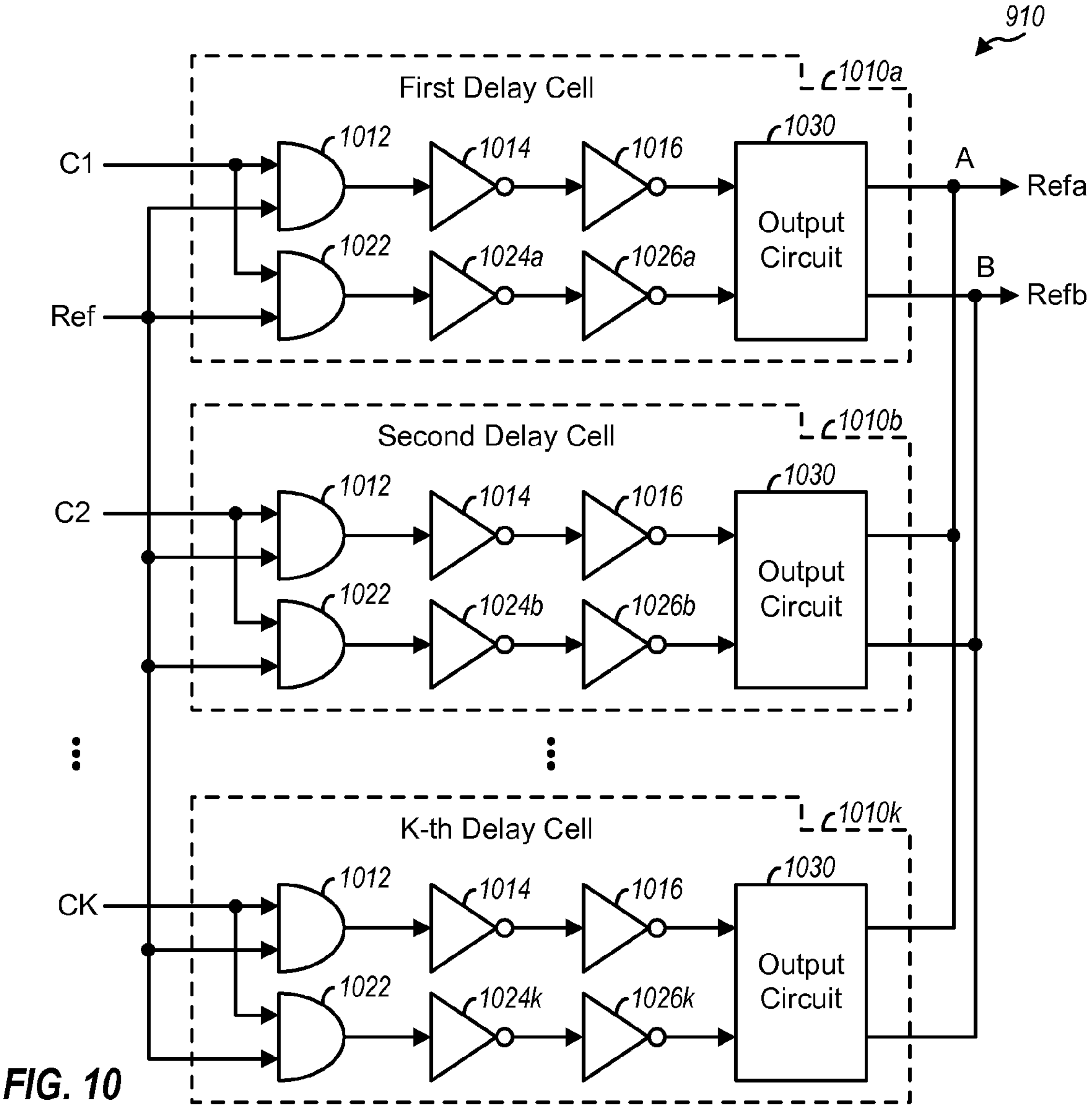
FIG. 10 shows an exemplary design of a delay block.

FIG. 10 shows an exemplary design of the first delay block 910 in FIG. 9. In this design, first delay block 910 includes K delay cells 1010*a* through 1010*k* coupled in parallel and receiving K different control signals, C1 through CK, respectively, where K may be any integer value greater than one. The K delay cells also receive the Ref signal and have their first outputs coupled to node A and their second outputs coupled to node B. The Refa and Refb signals are provided by nodes A and B, respectively.

Each delay cell 1010 includes two signal paths for the Ref signal. Within the first delay cell 1010*a*, the first signal path includes an AND gate 1012 and inverters 1014 and 1016 coupled in series. The second signal path includes an AND gate 1022 and inverters 1024*a* and 1026*a* coupled in series. In the first signal path, AND gate 1012 receives the C1 control signal for the first delay cell 1010*a* and the Ref signal and provides its output to inverter 1014. Inverter 1014 provides its output to inverter 1016, which further provides its output to a first input of an output circuit 1030. In the second signal path, AND gate 1022 receives the C1 control signal and the Ref signal and provides its output to inverter 1024*a*. Inverter 1024*a* provides its output to inverter 1026*a*, which further provides its output to a second input of output circuit 1030. The first signal paths for all K delay cells may be part of fixed delay 912 in FIG. 9. The second signal paths for all K delay cells may be part of variable delay 914 in FIG. 9.

In the exemplary design shown in FIG. 10, the first signal paths for all K delay cells 1010*a* through 1010*k* may be implemented in similar manner, e.g., with the same transistor sizes for inverters 1014 and 1016 in the K delay cells. The second signal paths for the K delay cells 1010*a* through 1010*k* may be implemented in different manners, e.g., with different transistor sizes for inverters 1024 and 1026 in the K delay cells. For example, inverters 1024*a* and 1026*a* in the first delay cell 1010*a* may be implemented with the smallest transistor size, inverters 1024*b* and 1026*b* in the second delay cell 1010*b* may be implemented with the next smallest transistor size, and so on, and inverters 1024*k* and 1026*k* in the last delay cell 1010*k* may be implemented with the largest transistor size. The transistor sizes for inverters 1024*a* and 1026*a* through inverters 1024*k* and 1024*k* may be selected such that the second paths in the K delay cells 1010*a* through 1010*k* have linearly longer delays. For example, the delay of the second path for the i-th delay cell may be given as $T_i \approx T_{base} + i \cdot \Delta T$, where $T_{base}$ is the delay of the second signal path of the first delay cell 1010*a*, and $\Delta T$ is the delta delay between the second signal paths of successive delay cells. The transistor sizes may be selected to achieve linearly longer delays for the second signal paths of the K delay cells.

The number of delay cells, K, may be determined based on the desired total delay adjustment and the desired delay resolution. The total delay adjustment may be $T_{inv}/2$, plus the expected delay offset between the first delay path 510 and the second delay path 510*b*, plus a margin. In one design, delay block 910 includes K=32 delay cells. Fewer or more delay cells may also be used.

One of the K delay cells may be selected (e.g., after performing a calibration procedure described below) to obtain the desired delay difference between the Refa and Refb signals. The selected delay cell may be enabled by activating the control signal for that delay cell. The activated control signal enables AND gates 1012 and 1022 as well as output circuit 1030 for the selected delay cell. The remaining delay cells may be disabled by de-activating the control signals for these delay cells. The de-activated control signals disable AND gates 1012 and 1022 as well as output circuit 1030 for the unselected delay cells. The Refa and Refb signals may then be driven by output circuit 1030 of only the selected delay cell.

The exemplary designs shown in FIGS. 9 and 10 may be used to delay the Ref1 and Ref2 signals by different amounts, as described above. The exemplary designs shown in FIGS. 9 and 10 may also be used to delay the input signal by different amounts for the TDC design shown in FIG. 4.

The first delay path 510*a* and the second delay path 510*b* may be designed to match one another but may have a delay offset due to layout mismatch and other factors. Calibration may be performed to measure the delay offset between the two delay paths and to adjust the Ref1 and Ref2 signals to compensate for this delay offset. Calibration may also be performed to adjust the delay of the Ref2 signal to be $T_{inv}/2$ more than the Ref1 signal.

Figure 11:
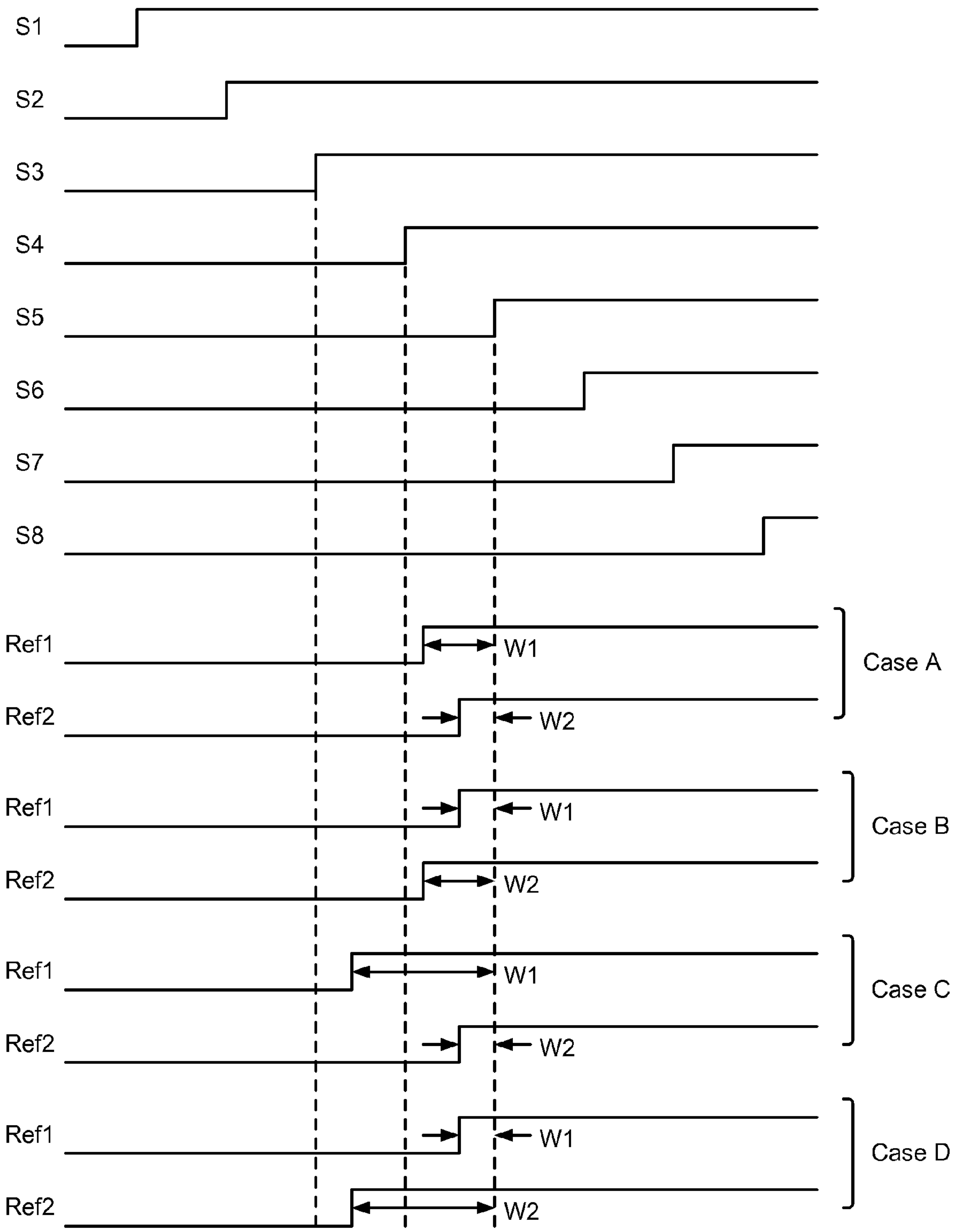
FIG. 11 illustrates four offset conditions for two reference signals.

FIG. 11 shows a timing diagram illustrating four possible offset conditions for the Ref1 and Ref2 signals, respectively. These four offset conditions are referred to as cases A, B, C and D. For simplicity, FIG. 11 shows only the first eight input signals S1 through S8 for the two delay paths 510*a* and 510*b*. FIG. 11 also shows the leading edges of the Ref1 and Ref2 signals with the shortest delays selected for the Ref1 and Ref2 signals via programmable delay unit 520. Calibration to measure and account for the delay offset between delay paths 510*a* and 510*b* may be performed as follows:

For case A, the leading edges of the Ref1 and Ref2 signals occur within one inverter delay, and the Ref1 signal leads the Ref2 signal. For case B, the leading edges of the Ref1 and Ref2 signals occur within one inverter delay, and the Ref2 signal leads the Ref1 signal. For both cases A and B, the output signals from the first delay path 510*a* may be D11 . . . D18='11110000'. The delay of the Ref1 signal may be increased by progressively larger amounts with variable delay unit 914 in FIG. 9 until the D15 signal toggles to '0'. This may be achieved by activating the C1 control signal, then the C2 control signal, then the C3 control signal, etc., for the first delay block 910 in FIG. 9. The delay of the Ref1 signal may then be recorded and denoted as W1. The output signals from the second delay path 510*b* may be D21 . . . D28='11110000'. The delay of the Ref2 signal may be increased by progressively larger amounts with variable delay unit 924 until the D25 signal toggles to '0'. The delay of the Ref2 signal may then be recorded and denoted as W2.

For case C, the leading edges of the Ref1 and Ref2 signals occur within two inverter delays, and the Ref1 signal leads the Ref2 signal. For case D, the leading edges of the Ref1 and Ref2 signals occur within two inverter delays, and the Ref2 signal leads the Ref1 signal. For case C, the output signals from the first delay path 510*a* may be D11 . . . D18='11100000'. The delay of the Ref1 signal may be increased by progressively larger amounts until the D14 and D15 signals both toggle to '0'. The delay of the Ref1 signal may then be recorded and denoted as W1. The output signals from the second delay path 510*b* may be D21 . . . D28='11110000'. The delay of the Ref2 signal may be increased by progressively larger amounts until the D25 signal toggles to '0'. The delay of the Ref2 signal may then be recorded and denoted as W2. For case D, the output signals from the first delay path 510*a* may be D11 . . . D18='11110000'. The delay of the Ref1 signal may be increased by progressively larger amounts until the D15 signal toggles to '0'. The delay of the Ref1 signal may then be recorded and denoted as W1. The output signals from the second delay path 510*b* may be D21 . . . D28='11100000'. The delay of the Ref2 signal may be increased by progressively larger amounts until the D24 and D25 signals both toggle to '0'. The delay of the Ref2 signal may then be recorded and denoted as W2.

In general, calibration for delay offset may be performed by individually delaying the Refx signal of each delay path until (i) the next output signal for the delay path toggles and (ii) an equal number of ones (or ones) are obtained for the two delay paths. The delays for the Ref1 and Ref2 signals that align the outputs of the two delay paths may be recorded and denoted as W1 and W2, respectively.

After completing the calibration for delay offset, the delay of the Ref2 signal may be further delayed until the next output signal toggles, and the delay of the Ref2 signal may then be recorded and denoted as W2full. The difference between W2full and W2 is one inverter delay. One half inverter delay may be obtained by taking half of the difference between W2full and W2. The delay of the Ref2 signal may then be determined as follows:

$$W2\text{half} = W2 + \frac{W2\text{full} - W2}{2}, \qquad \text{Eq (1)}$$

where W2half is the delay of the Ref2 signal to calibrate for the delay offset and to obtain a delay of $T_{inv}/2$ relative to the Ref1 signal.

In summary, calibration of the TDC may be performed as follows:

1. Record the output signals from the first delay path and the output signals from the second delay path,
2. Increment the delay of the Ref1 signal until the next output signal from the first delay path toggles,
3. Record the delay W1 of the Ref1 signal,
4. Increment the delay of the Ref2 signal until the next output signal from the second delay path toggles,
3. Record the delay W2 of the Ref2 signal,
6. Increment the delay of the Ref2 signal further until the next output signal from the second delay path toggles,
7. Record the delay W2full of the Ref2 signal with the additional inverter delay,
8. Calculate the delay W2half to account for the delay offset between the two delay paths and to obtain one half inverter delay for the Ref2 signal, and
9. Apply the delays W1 and W2half for the Ref1 and Ref2 signals, respectively.

The description above is for two delay paths, e.g., as shown in FIG. 5. Calibration may be performed in similar manner for more than two delay paths. For example, calibration for a TDC with four delay paths may be performed as follows. The delay of the Ref signal for each delay path may be incremented until the next output signal from that delay path toggles. The delays for the four delay paths may be denoted as W1, W2, W3 and W4. The delay of the Ref signal for each of the second, third and fourth delay paths may be further incremented until the next output signal from that delay path toggles. The delays for the three delay paths with the additional inverter delay may be denoted as W2full, W3full and W4full. The delay of the Ref2, Ref3 and Ref4 signals for the second, third and fourth delay paths may then be determined as follows:

$$W2\text{delay}=W2+(W2\text{full}-W2)/4 \qquad \text{Eq (2a)}$$

$$W3\text{delay}=W3+(W3\text{full}-W3)/2, \text{ and} \qquad \text{Eq (2b)}$$

$$W4\text{delay}=W4+3\ (W4\text{full}-W4)/4, \qquad \text{Eq (2c)}$$

where W1, W2delay, W3delay, and W4delay are the delays for the Ref1, Ref2, Ref3 and Ref4 signals, respectively.

Calibration may be performed using a test signal for the input signal (e.g., instead of the oscillator signal). The test signal may be a delayed reference signal or some other signal. Calibration may thus be performed at the reference signal frequency (instead of the oscillator signal frequency).

Figure 12:
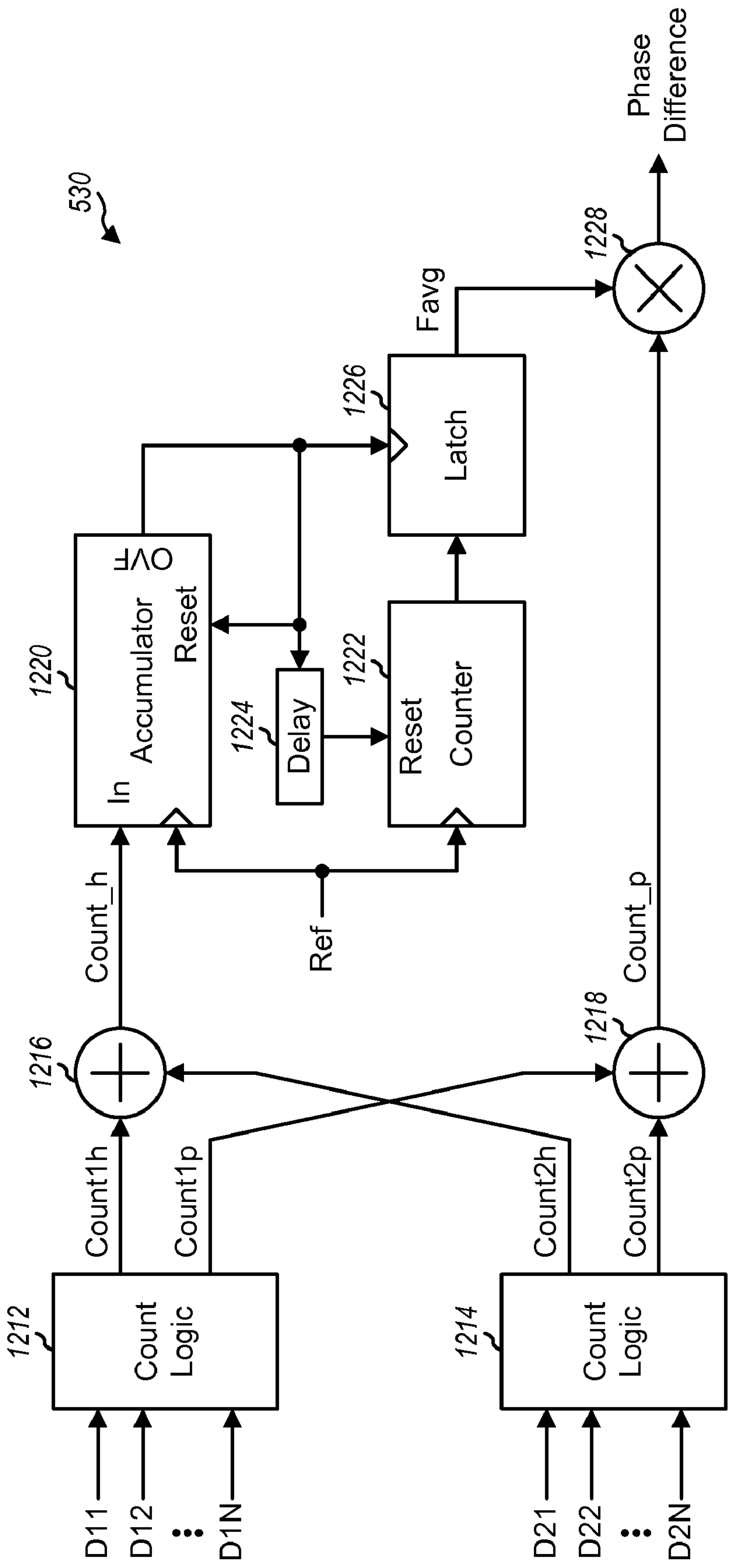
FIG. 12 shows an exemplary design of a phase computation unit.

FIG. 12 shows a block diagram of an exemplary design of phase computation unit 530 in FIG. 5. Within phase computation unit 530, a count logic 1212 receives the D11 through D1N output signals from the first delay path 510*a* and determines the logic value (either one or zero) of the D11 signal. Count logic 1212 then counts the number of ones (or zeros) matching that of the D11 signal until the first flip in polarity and provides this count as Count1*p*. Count logic 1212 then counts the number of zeros (or ones) from the first flip to the second flip in polarity and provides this count as Count1*h*. In the example shown in FIG. 6, Count1*p* would be equal to 5 and would correspond to $T_{diff1}$ for the first delay path 510*a*. Count1*h* would be equal to 8 and would correspond to $T_{half1}$ for the first delay path 510*a*. Similarly, a count logic 1214 receives the D21 through D2N output signals from the second delay path 510*b* and determines the logic value (either one or zero) of the D21 signal. Count logic 1214 then counts the number of ones (or zeros) matching that of the D21 signal until the first flip in polarity and provides this count as Count2*p*. Count logic 1214 then counts the number of zeros (or ones) from the first flip to the second flip in polarity and provides this count as Count2*h*.

A summer 1216 receives and sums Count1*h* and Count2*h* and provides a Count_h. A summer 1218 receives and sums Count1*p* and Count2*p* and provides a Count_p. An accumulator 1220 receives and accumulates Count_h from summer 1216 in each cycle of the Ref signal. A counter 1222 increments by one in each cycle of the Ref signal. Accumulator 1220 may be an L-bit (e.g., 11-bit) accumulator and may have a range of 0 to $2^L-1$. When accumulator 1220 exceeds the maximum value of $2^L-1$, an overflow (OVF) output toggles from logic low to logic high. The overflow output causes a latch 1226 to latch the count value from counter 1222. The overflow output also resets accumulator 1214 and, after a short delay by a delay circuit 1224, resets counter 1222. Delay circuit 1224 ensures that latch 1226 can capture the count value before counter 1222 is reset. Latch 1226 provides the latched value as an average frequency, Favg, of the input signal for the first and second delay paths 510. A multiplier 1228 multiplies Count_p with Favg and provides the phase difference between the input signal and the reference signal.

For phase computation unit 530, Count1*p* for $T_{diff1}$ and Count1*h* for $T_{half1}$ from count logic 1212 may be expressed as:

$$\text{Count1}\,p \approx \frac{T_{diff1}}{T_{inv}}, \qquad \text{Eq (3)}$$

and $$\text{Count1}\,h \approx \frac{T_{half1}}{T_{inv}} = \frac{T_{full1}}{2\cdot T_{inv}}. \qquad \text{Eq (4)}$$

Count1*p* and Count1*h* are integer values that approximate the quantities in the right hand side of equations (3) and (4). Count1*p* is the number of inverter delays that appropriates the phase difference $T_{diff1}$. Count1*h* is the number of inverter delays that appropriates one half cycle of the input signal, $T_{half1}$. Count2*p* for $T_{diff2}$ and Count2*h* for $T_{half2}$ from count logic 1214 may be determined in similar manner.

For a design in which accumulator 1220 is a 11-bit accumulator, the average frequency from latch 1226 may be expressed as:

$$Favg \approx \frac{2^{11}}{\text{Count\_h}} = \frac{2048}{\dfrac{T_{full}}{2\cdot T_{inv}}} = 4096\cdot\frac{T_{inv}}{T_{full}}, \qquad \text{Eq (5)}$$

where $T_{full}$ is twice the average of $T_{half1}$ and $T_{half2}$.

The phase difference from multiplier 1228 may be expressed as:

$$\begin{aligned}\text{Phase } Diff = \text{Count\_p}\times Favg &\approx \frac{T_{diff}}{T_{inv}}\cdot 4096\cdot\frac{T_{inv}}{T_{full}} \\ &= 4096\cdot\frac{T_{diff}}{T_{full}},\end{aligned} \qquad \text{Eq (6)}$$

where $T_{diff}$ is the average of $T_{diff1}$ and $T_{diff2}$. As shown in equation (6), the phase difference is a fractional phase difference given relative to one cycle of the input signal. The scaling factor 4096 is dependent on the size of accumulator 1220.

The TDC described herein may have improved resolution (e.g., by a factor of two or more) by using a fractional (e.g., ½) inverter delay. The fractional inverter delay may be accurately generated with digital circuits across process, voltage and temperature (PVT) corners based on the techniques described herein. The fractional inverter delay may also be reliably estimated as described above. The TDC may be used for a DPLL, e.g., as shown in FIG. 1 or 2. The DPLL may be part of a frequency synthesizer, a two-point modulator, or some other circuit. The finer resolution for the TDC achieved with the techniques described herein may improve the phase noise of the frequency synthesizer and/or the performance of other circuit in which the TDC is used.

In an exemplary design, an apparatus may include a TDC comprising first and second delay paths, a delay unit, and a phase computation unit, e.g., as shown in FIG. 3, 4 or 5. The first delay path may receive a first input signal and a first reference signal and may provide a first output indicative of a phase difference between the first input signal and the first reference signal. The second delay path may receive a second input signal and a second reference signal and may provide a second output indicative of a phase difference between the second input signal and the second reference signal. The delay unit may delay the second input signal relative to the first input signal or may delay the second reference signal relative to the first reference signal. The phase computation unit may receive the first and second outputs from the first and second delay paths and may provide a phase difference between an input signal and a reference signal. The first and second input signals may be derived based on the input signal, and the first and second reference signals may be derived based on the reference signal, e.g., as shown in FIG. 3, 4 or 5. The TDC may also comprise one or more additional delay paths and one or more additional delay units, e.g., as shown in FIG. 3 or 4.

In an exemplary design, the delay unit may receive the first reference signal and provide a delayed first reference signal as the second reference signal, e.g., as shown in FIG. 3. The second delay path may receive the first input signal as the second input signal. In another exemplary design, the delay unit may receive the first input signal and provide a delayed first input signal as the second input signal, e.g., as shown in FIG. 4. The second delay path may receive the first reference signal as the second reference signal. In yet another exemplary design, the delay unit may receive the reference signal, provide the reference signal delayed by a first amount as the first reference signal, and provide the reference signal delayed by a second amount as the second reference signal, e.g., as shown in FIG. 5. The delay unit may also delay the second input signal and/or the second reference signal relative to the first input signal and/or the first reference signal in other manners.

In an exemplary design, the delay unit may delay the second reference signal by one half inverter delay relative to the first reference signal. The delay unit may also delay the second reference signal by some other fraction of one inverter delay.

In an exemplary design, the delay unit may comprise first and second delay blocks, e.g., as shown in FIG. 9. The first delay block may provide a fixed delay for the first input signal or the first reference signal and may provide a variable delay for the second input signal or the second reference signal. The second delay block may provide a variable delay for the first input signal or the first reference signal and may provide a fixed delay for the second input signal or the second reference signal.

In an exemplary design, the delay unit may comprise a plurality of delay cells coupled in parallel, e.g., as shown in FIG. 10. Each delay cell may comprise a first signal path and a second signal path. The first signal paths for all delay cells may provide approximately equal delay, and the second signal paths for different delay cells may provide different delays. One of the plurality of delay cells may be selected to delay the second input signal relative to the first input signal or to delay the second reference signal relative to the first reference signal.

In an exemplary design, the first delay path may comprise a first set of inverters and a set of flip-flops. The first set of inverters may be coupled in series and may receive the first input signal. The set of flip-flops may be coupled to the first set of inverters and may receive the first reference signal and provide a set of output signals for the first output. For a differential design, the first delay path may further comprise a second set of inverters coupled in series and receiving an inverted first input signal. The set of flip-flops may be further coupled to the second set of inverters, and each flip-flop may receive a respective differential input signal from the first and second sets of inverters. The second delay path may be implemented in similar manner as the first delay path.

In an exemplary design, the phase computation unit may receive the first output from the first delay path and the second output from the second delay path and may provide the phase difference between the input signal and the reference signal. The first and second outputs may have a resolution of one inverter delay, and the phase difference between the input signal and the reference signal may have a resolution of less than one inverter delay.

In another exemplary design, an apparatus may include a DPLL comprising a TDC and a loop filter. The TDC may receive an input signal and a reference signal and may provide a phase difference between the input signal and the reference signal. The phase difference may have a resolution of less than one inverter delay. The TDC may comprise first and second delay paths, a delay unit, and a phase computation unit, which may be implemented as described above. The loop filter may receive an error signal derived based on the phase difference from the TDC and may provide a control signal for an oscillator.

In one exemplary design, the DPLL may further comprise an RF accumulator, e.g., as shown in FIG. 1. The RF accumulator may receive an oscillator signal from the oscillator and may provide a coarse phase difference having a resolution of one oscillator signal cycle. The error signal may then be derived based further on the coarse phase difference. In another exemplary design, the DPLL may further comprise a signal multiplexer, e.g., as shown in FIG. 2. The signal multiplexer may receive a feedback signal derived based on the oscillator signal and a clock signal. The signal multiplexer may provide one of the feedback signal and the clock signal as the input signal to the TDC and may provide the other one of the feedback signal and the clock signal as the reference signal to the TDC. The DPLL may further comprise other circuit blocks, e.g., as shown in FIG. 1 or 2.

Figure 13:
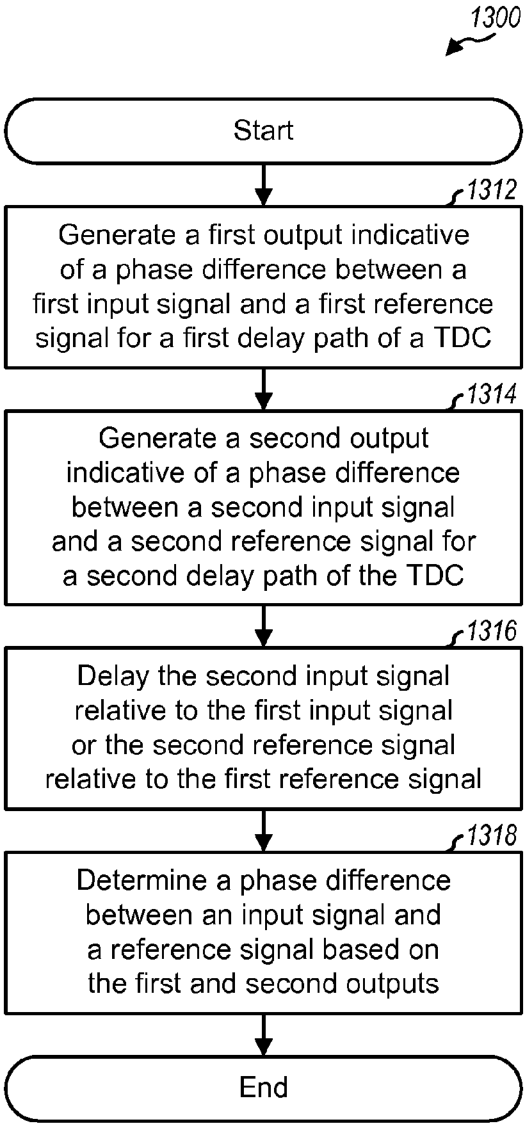
FIG. 13 shows a process for operating a TDC comprising two delay paths.

FIG. 13 shows an exemplary design of a process 1300 for operating a TDC comprising first and second delay paths. A first output (e.g., Dout1) indicative of a phase difference between a first input signal and a first reference signal for the first delay path of the TDC may be generated (block 1312). A second output (e.g., Dout2) indicative of a phase difference between a second input signal and a second reference signal for the second delay path of the TDC may also be generated (block 1314). In an exemplary design of block 1312, the first input signal may be delayed by different amounts with a set of inverters to obtain a set of delayed input signals. The set of delayed input signals may be latched by a set of flip-flops with the first reference signal to obtain the first output. The second output may be generated in similar manner as the first output, albeit with a different input signal and/or a different reference signal.

The second input signal may be delayed relative to the first input signal, or the second reference signal may be delayed relative to the first reference signal (block 1316). In an exemplary design of block 1316, the first reference signal may be delayed by a first amount, and the second reference signal may be delayed by a second amount to time align the first and second reference signals. The second reference signal may be further delayed by one half inverter delay relative to the first reference signal.

A phase difference between an input signal and a reference signal may be determined based on the first and second outputs (block 1318). The first and second input signals may be derived based on the input signal, and the first and second reference signals may be derived based on the reference signal. The first and second outputs may have a resolution of one inverter delay, and the phase difference between the input signal and the reference signal may have a resolution of less than one inverter delay.

Figure 14:
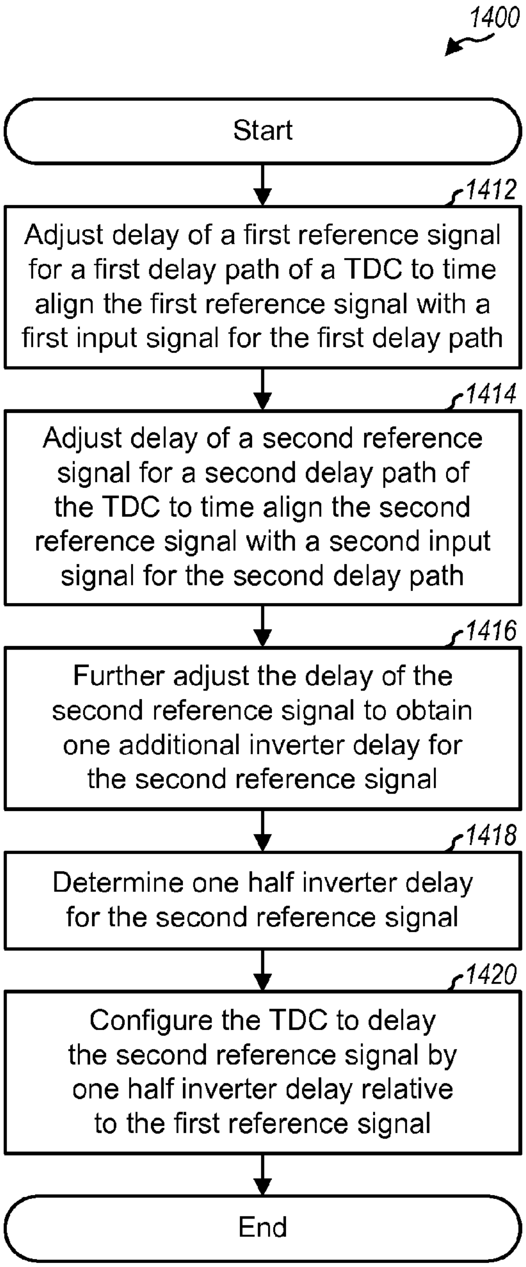
FIG. 14 shows a process for calibrating a TDC comprising two delay paths.

FIG. 14 shows an exemplary design of a process 1400 for calibrating a TDC comprising first and second delay paths. The delay of a first reference signal for the first delay path may be adjusted to time align the first reference signal with a first input signal for the first delay path (block 1412). The delay of a second reference signal for the second delay path may be adjusted to time align the second reference signal with a second input signal for the second delay path (block 1414). The delay of each reference signal may be adjusted in increments of less than one inverter delay.

The delay of the second reference signal may be further adjusted to obtain one additional inverter delay for the second reference signal (block 1416). One half inverter delay for the second reference signal may then be determined based on (i) the delay to time align the second reference signal with the second input signal and (ii) the delay to obtain one additional inverter delay for the second reference signal, e.g., as shown in equation (1) (block 1418). The TDC may be configured to delay the second reference signal by one half inverter delay relative to the first reference signal (block 1420). The second reference signal may also be delayed by some other fraction of one inverter delay. The second input signal may also be delayed relative to the first input signal (instead of the second reference signal being delayed relative to the first reference signal).

In an exemplary design of block 1414, N output signals from the second delay path may be received, where N may be greater than one. L consecutive output signals, starting with a first output signal, having a first logic value may be identified, where L may be one or greater. The delay of the second reference signal may then be adjusted until an (L+1)-th output signal toggles from a second logic value to the first logic value. The delay of the first reference signal may be adjusted in similar manner. In an exemplary design of block 1416, the delay of the second reference signal may be further delayed until an (L+2)-th output signal toggles from the second logic value to the first logic value.

The TDCs and DPLLs described herein may be used for various applications such as communication, computing, networking, personal electronics, etc. For example, the TDCs and DPLLs may be used for wireless communication devices, cellular phones, personal digital assistants (PDAs), handheld devices, gaming devices, computing devices, laptop computers, consumer electronics devices, personal computers, cordless phones, etc. An example use of the TDCs and DPLLs in a wireless communication device is described below.

Figure 15:
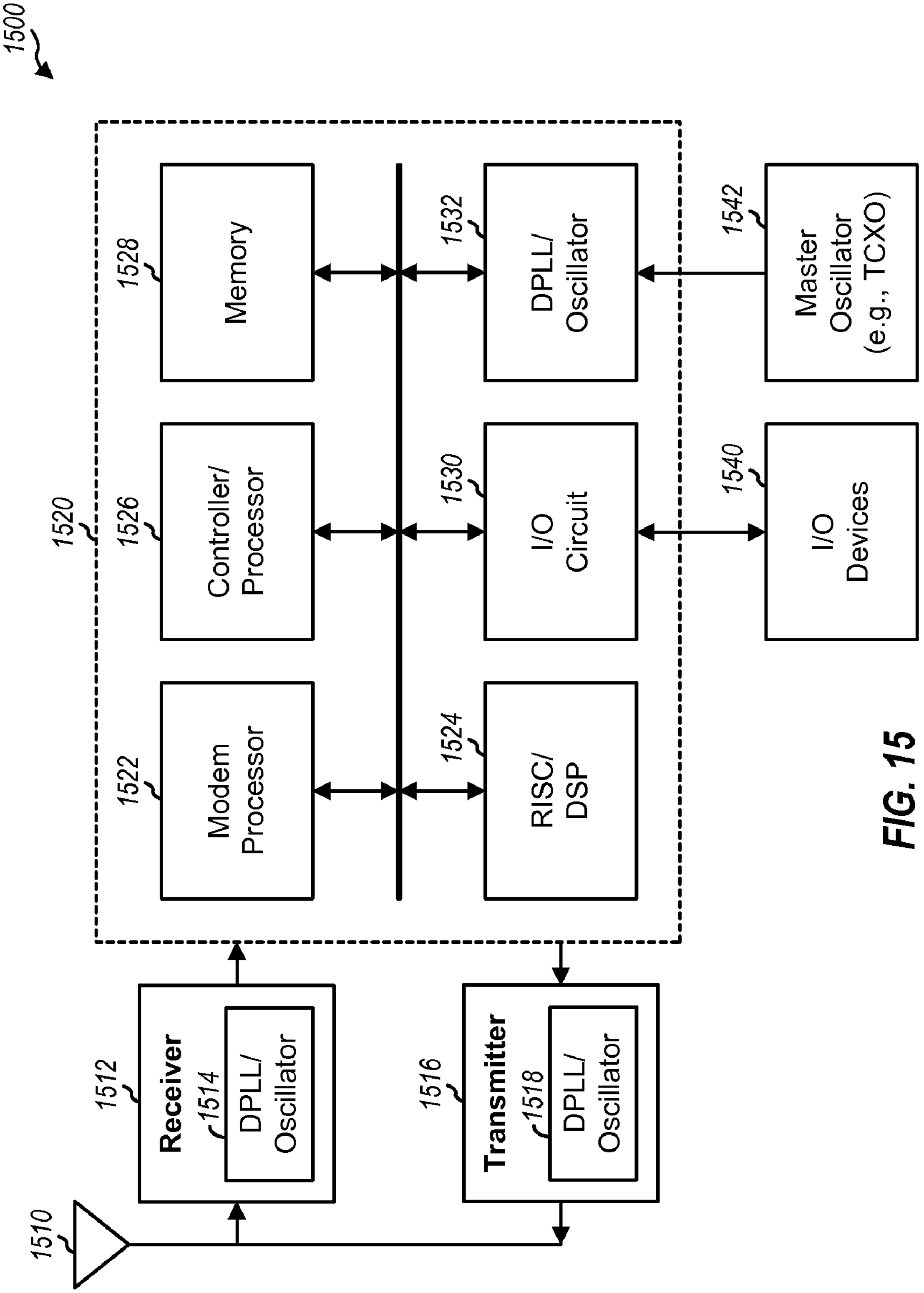
FIG. 15 shows an exemplary design of a wireless communication device.

FIG. 15 shows a block diagram of an exemplary design of a wireless communication device 1500 for a wireless communication system. Wireless device 1500 may be a cellular phone, a terminal, a handset, a wireless modem, etc. The wireless communication system may be a Code Division Multiple Access (CDMA) system, a Global System for Mobile Communications (GSM) system, a Long Term Evolution (LTE) system, a wireless local area network (WLAN) system, etc.

Wireless device 1500 is capable of providing bi-directional communication via a receive path and a transmit path. In the receive path, signals transmitted by base stations (not shown) are received by an antenna 1510 and provided to a receiver 1512. Receiver 1512 conditions and digitizes the received signal and provides samples to a section 1520 for further processing. In the transmit path, a transmitter 1516 receives data to be transmitted from section 1520, processes and conditions the data, and generates a modulated signal, which is transmitted via antenna 1510 to the base stations. Receiver 1512 and transmitter 1516 may support CDMA, GSM, LTE, WLAN, etc.

Section 1520 includes various processing, interface, and memory units such as, for example, a modem processor 1522, a reduced instruction set computer/digital signal processor (RISC/DSP) 1524, a controller/processor 1526, a memory 1528, an input/output (I/O) circuit 1530, and a DPLL/oscillator 1532. Modem processor 1522 may perform processing for data transmission and reception, e.g., encoding, modulation, demodulation, decoding, etc. RISC/DSP 1524 may perform general and specialized processing for wireless device 1500. Controller/processor 1526 may direct the operation of various units within section 1520. Processor 1526 and/or other modules may perform or direct process 1300 in FIG. 13, process 1400 in FIG. 14, and/or other processes described herein. Memory 1528 may store data and/or instructions for various units within section 1520. I/O circuit 1530 may communicate with external I/O devices 1540.

DPLL/oscillator 1532 may generate clocks for the processing units within section 1520. A DPLL/oscillator 1514 may generate a receive local oscillator (LO) signal used by receiver 1512 for frequency downconversion and/or demodulation. A DPLL/oscillator 1518 may generate a transmit LO signal used by transmitter 1516 for frequency upconversion and/or modulation. DPLL/oscillator 1514, 1518 and/or 1532 may each be implemented with DPLL 100 in FIG. 1, DPLL 200 in FIG. 2, TDC 300 in FIG. 3, TDC 400 in FIG. 4, TDC 500 in FIG. 5, etc. A master oscillator 1542 may generate an accurate master clock for DPLL/oscillator 1532 and/or other DPLLs/oscillators. Master oscillator 1542 may be an XO, a VCXO, a TCXO, etc.

The TDCs and DPLLs described herein may be used for frequency synthesis in receiver 1512 and/or transmitter 1516, which may operate over a wide range of frequencies. The DPLL may be used with a DCO to implement an all-digital phase-locked loop (ADPLL).

The TDCs and DPLLs described herein may be implemented on an IC, an analog IC, an RF IC (RFIC), a mixed-signal IC, an application specific integrated circuit (ASIC), a printed circuit board (PCB), an electronics device, etc. The TDCs and DPLLs may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc. The TDCs and DPLLs may be implemented with deep sub-micron RFCMOS transistors and may be able to achieve good performance and high level of integration.

An apparatus implementing a TDC and/or a DPLL described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:

a first delay path configured to receive a first input signal and a first reference signal and to provide a first output indicative of a phase difference between the first input signal and the first reference signal;

a second delay path configured to receive a second input signal and a second reference signal and to provide a second output indicative of a phase difference between the second input signal and the second reference signal; and a delay unit configured to delay the second input signal relative to the first input signal or to delay the second reference signal relative to the first reference signal.

2. The apparatus of claim 1, wherein the delay unit is configured to receive the first reference signal and to provide a delayed first reference signal as the second reference signal, and wherein the second delay path is configured to receive the first input signal as the second input signal.

3. The apparatus of claim 1, wherein the delay unit is configured to receive the first input signal and to provide a delayed first input signal as the second input signal, and wherein the second delay path is configured to receive the first reference signal as the second reference signal.

4. The apparatus of claim 1, wherein the delay unit is configured to receive a reference signal, to provide the reference signal delayed by a first amount as the first reference signal, and to provide the reference signal delayed by a second amount as the second reference signal.

5. The apparatus of claim 1, wherein the delay unit is configured to delay the second reference signal by one half inverter delay relative to the first reference signal.

6. The apparatus of claim 1, wherein the delay unit comprises a first delay block configured to provide a fixed delay for the first input signal or the first reference signal and to provide a variable delay for the second input signal or the second reference signal.

7. The apparatus of claim 6, wherein the delay unit further comprises a second delay block coupled to the first delay block and configured to provide a variable delay for the first input signal or the first reference signal and to provide a fixed delay for the second input signal or the second reference signal.

8. The apparatus of claim 1, wherein the delay unit comprises a plurality of delay cells coupled in parallel, each delay cell comprising a first signal path and a second signal path, wherein the first signal paths for the plurality of delay cells provide equal delay, wherein the second signal paths for the plurality of delay cells provide different delays, and wherein one of the plurality of delay cells is selected to delay the second input signal relative to the first input signal or to delay the second reference signal relative to the first reference signal.

9. The apparatus of claim 1, wherein the first delay path comprises a first set of inverters coupled in series and configured to receive the first input signal, and a set of flip-flops coupled to the first set of inverters and configured to receive the first reference signal and provide a set of output signals for the first output.

10. The apparatus of claim 9, wherein the first delay path further comprises a second set of inverters coupled in series and configured to receive an inverted first input signal, and wherein the set of flip-flops is further coupled to the second set of inverters, each flip-flop receiving a respective differential input signal from the first and second sets of inverters.

11. The apparatus of claim 1, further comprising:

a phase computation unit configured to receive the first and second outputs from the first and second delay paths and to provide the phase difference between the first input signal and the first reference signal, wherein the first and second input signals are derived based on the input signal, and wherein the first and second reference signals are derived based on the reference signal.

12. The apparatus of claim 11, wherein the first and second outputs from the first and second delay paths have a resolution of one inverter delay, and wherein the phase difference from the phase computation unit has a resolution of less than one inverter delay.

13. A method of operating a time-to-digital converter (TDC) comprising first and second delay paths, the method comprising:

generating a first output indicative of a phase difference between a first input signal and a first reference signal for the first delay path of the TDC;

generating a second output indicative of a phase difference between a second input signal and a second reference signal for the second delay path of the TDC; and delaying the second input signal relative to the first input signal or delaying the second reference signal relative to the first reference signal.

14. The method of claim 13, wherein the delaying comprises delaying the second reference signal by one half inverter delay relative to the first reference signal.

15. The method of claim 13, wherein the delaying comprises delaying the first reference signal by a first amount and delaying the second reference signal by a second amount to time align the first and second reference signals, and further delaying the second reference signal by one half inverter delay relative to the first reference signal.

16. The method of claim 13, wherein the generating the first output comprises delaying the first input signal by different amounts to obtain a set of delayed input signals, and latching the set of delayed input signals with the first reference signal to obtain a set of output signals for the first output.

17. The method of claim 13, further comprising:

determining the phase difference between the first input signal and the first reference signal based on the first and second outputs, wherein the first and second input signals are derived based on the input signal, and wherein the first and second reference signals are derived based on the reference signal.

18. The apparatus of claim 17, wherein the first and second outputs have a resolution of one inverter delay, and wherein the phase difference between the input signal and the reference signal has a resolution of less than one inverter delay.

19. An apparatus comprising:

means for generating a first output indicative of a phase difference between a first input signal and a first reference signal for a first delay path of a time-to-digital converter (TDC);

means for generating a second output indicative of a phase difference between a second input signal and a second reference signal for a second delay path of the TDC; and means for delaying the second input signal relative to the first input signal or delaying the second reference signal relative to the first reference signal.

20. The apparatus of claim 19, wherein the means for delaying comprises means for delaying the second reference signal by one half inverter delay relative to the first reference signal.

21. The apparatus of claim 19, further comprising:

means for determining the phase difference between the first input signal and the first reference signal based on the first and second outputs, wherein the first and second input signals are derived based on the input signal, and wherein the first and second reference signals are derived based on the reference signal.

22. The apparatus of claim 21, wherein the first and second outputs have a resolution of one inverter delay, and wherein the phase difference between the input signal and the reference signal has a resolution of less than one inverter delay.

23. A computer program product, comprising:

a non-transitory computer-readable medium comprising:

code for causing at least one computer to adjust delay of a first reference signal for a first delay path of a time-to-digital converter (TDC) to time align the first reference signal with a first input signal for the first delay path, code for causing the at least one computer to adjust delay of a second reference signal for a second delay path of the TDC to time align the second reference signal with a second input signal for the second delay path, code for causing the at least one computer to further adjust the delay of the second reference signal to obtain one additional inverter delay for the second reference signal, code for causing the at least one computer to determine one half inverter delay for the second reference signal based on the delay to time align the second reference signal with the second input signal and the delay to obtain one additional inverter delay for the second reference signal, and code for causing the at least one computer to configure the TDC to delay the second reference signal by one half inverter delay relative to the first reference signal.

* * * * *